(12) United States Patent
Usami

(10) Patent No.: US 7,821,096 B2
(45) Date of Patent: Oct. 26, 2010

(54) SEMICONDUCTOR INTEGRATED CIRCUIT AND SYSTEM LSI INCLUDING THE SAME

(75) Inventor: Shiro Usami, Osaka (JP)

(73) Assignee: Panasonic Corporation, Osaka (JP)

( * ) Notice: Subject to any disclaimer, the term of this patent is extended or adjusted under 35 U.S.C. 154(b) by 516 days.

(21) Appl. No.: 11/783,133

(22) Filed: Apr. 6, 2007

(65) Prior Publication Data

US 2007/0252231 A1 Nov. 1, 2007

(30) Foreign Application Priority Data

Apr. 27, 2006 (JP) ............................. 2006-124110

(51) Int. Cl.
*H01L 29/00* (2006.01)
(52) U.S. Cl. ........... 257/499; 257/E21.36; 257/E21.352
(58) Field of Classification Search ................. 257/499, 257/109, E29.325, E29.327, E29.328; 361/91.5, 361/100
See application file for complete search history.

(56) References Cited

U.S. PATENT DOCUMENTS

| 5,066,999 | A | * | 11/1991 | Casper | 257/786 |
| 5,196,692 | A | * | 3/1993 | Arinaga et al. | 250/208.1 |
| 5,497,023 | A | * | 3/1996 | Nakazato et al. | 257/394 |
| 5,565,698 | A | * | 10/1996 | Obermeier | 257/360 |
| 5,682,047 | A | * | 10/1997 | Consiglio et al. | 257/335 |
| 5,686,750 | A | * | 11/1997 | Takahashi | 257/328 |
| 5,760,428 | A | * | 6/1998 | Colwell et al. | 257/206 |
| 5,767,552 | A | * | 6/1998 | Casper et al. | 257/379 |
| 5,796,147 | A | * | 8/1998 | Ono | 257/355 |
| 5,910,675 | A | | 6/1999 | Horiguchi et al. | |

(Continued)

FOREIGN PATENT DOCUMENTS

JP 03-234063 10/1991

(Continued)

OTHER PUBLICATIONS

Chinese Office Action, w/ English translation thereof, issued in Chinese Patent Application No. CN 200710091778.8 dated Dec. 11, 2009.

*Primary Examiner*—Leonardo Andújar
*Assistant Examiner*—William Harriston
(74) *Attorney, Agent, or Firm*—McDermott Will & Emery LLP

(57) ABSTRACT

A semiconductor integrated circuit having a diode element includes a diffusion layer which constitutes the anode and two diffusion layers which are provided on the left and right sides of the anode and which constitute the cathode, such that the anode and the cathode constitute the diode. A well contact is provided to surround both the diffusion layers of the anode and cathode. Distance tS between a longer side of the well contact and the diffusion layers of the cathode is shorter, while distance tL between a shorter side of the well contact and the diffusion layers of the anode and cathode is longer (tL>tS). Accordingly, the resistance value between the diffusion layer of the anode and the shorter side of the well contact is larger, so that the current from the diffusion layer of the anode is unlikely to flow toward the shorter side of the well contact. Thus, convergence of the current at the contact holes of the diffusion layer of the anode is reduced, so that the reliability of the diode element improves.

19 Claims, 21 Drawing Sheets

U.S. PATENT DOCUMENTS

| | | | |
|---|---|---|---|
| 5,955,764 A * | 9/1999 | Katsube | 257/355 |
| 6,043,542 A * | 3/2000 | Keeth et al. | 257/372 |
| 6,118,154 A * | 9/2000 | Yamaguchi et al. | 257/360 |
| 6,586,290 B1 * | 7/2003 | Casper et al. | 257/358 |
| 6,587,320 B1 * | 7/2003 | Russ et al. | 257/361 |
| 6,885,077 B2 * | 4/2005 | Dietl et al. | 257/486 |
| 7,064,393 B2 | 6/2006 | Mergens et al. | |
| 2002/0153571 A1 | 10/2002 | Mergens et al. | |
| 2002/0190279 A1 * | 12/2002 | Nakatsuka | 257/204 |
| 2004/0012066 A1 * | 1/2004 | Dietl et al. | 257/471 |
| 2004/0150053 A1 * | 8/2004 | Ishibashi et al. | 257/371 |
| 2004/0164356 A1 * | 8/2004 | Josef Mergens et al. | 257/360 |
| 2006/0226499 A1 * | 10/2006 | Shimizu | 257/409 |

FOREIGN PATENT DOCUMENTS

| | | |
|---|---|---|
| JP | 11-135734 | 5/1999 |

* cited by examiner

SEMICONDUCTOR INTEGRATED CIRCUIT AND SYSTEM LSI INCLUDING THE SAME

CROSS-REFERENCE TO RELATED APPLICATIONS

This Non-provisional application claims priority under 35 U.S.C. §119(a) on Patent Application No. 2006-124110 filed in Japan on Apr. 27, 2006, the entire contents of which are hereby incorporated by reference.

BACKGROUND OF THE INVENTION

The present invention relates to improvements of a semiconductor integrated circuit including a diode and a system LSI.

In recent years, development of system LSIs having higher functions has entailed coexistence of a plurality of digital circuit blocks and a plurality of analog circuit blocks in one chip. This configuration produces such a problem that noise from the digital circuit blocks propagates to the analog circuit blocks. To avoid this in the system LSI, the power supply of the digital circuit blocks and the power supply of the analog circuit blocks are separate from each other. However, for the purpose of protection against damage due to electro static discharge (ESD), a single unit of protection device formed by a pair of diodes D1 and D2 placed in opposite directions is inserted between the power supply of the digital circuit blocks and the power supply of the analog circuit blocks as shown in FIG. 20. Insertion of these diode elements D1 and D2 can reduce the propagation of power supply noise and can ensure surge resistance to ESD.

A specific structure of such diode elements D1 and D2 provided for the purpose of reducing noise propagation is realized by MOS transistors as disclosed in, for example, Japanese Patent No. 2598147.

With respect to reduction in area, a desirable specific structure of the diode elements D1 and D2 is formed by gate-less diode elements instead of MOS transistors used in the conventional structure.

A proposed structure of such a diode element is, for example, one shown in FIG. 21. The diode element D shown in FIG. 21 includes, over a well 1, a diffusion layer 5 which constitutes the anode and diffusion layers 4 provided on the left and right sides of the diffusion layer 5 which constitute the cathode. These diffusion layers 4 and 5 are both formed in a pattern of rectangular strips. Around the diffusion layers 4 and 5 constituting the anode and cathode, a well contact 2 is provided to surround the diffusion layers 4 and 5 constituting the anode and cathode such that noise from the anode and cathode does not propagate to the outside. The diffusion layers 4 and 5 constituting the anode and cathode and the well contact 2 are provided with a large number of contact holes 3 formed thereover for connection with the outside.

When a surge voltage is applied to such a diode element D, a current is allowed to flow from the diffusion layer 5 constituting the anode to the diffusion layers 4 constituting the cathode as illustrated by solid lines in FIG. 22, whereby the diode element D is discharged and absorbs the surge voltage.

However, it was found that the above-described structure causes the following problem. Namely, since the diode element D shown in FIG. 21 is surrounded by the well contact 2, a current flows from the diffusion layer 5 constituting the anode to neighboring part of the well contact 2 as illustrated by broken lines in FIG. 22 in addition to the current flowing from the diffusion layer 5 constituting the anode to the diffusion layers 4 constituting the cathode. In this case, it is expected that the current converges at contact holes 3 of the anode diffusion layer 5 in the vicinity of the well contact 2 to cause breakage of the contact holes 3.

Such an undesirable result might be avoided by employing such a structure that, for example, the four corners of the diffusion layer 5 constituting the anode are truncated, and the contact holes 3 of the diffusion layer 5 are located distant from the four corners, such that electric field convergence at the corners is reduced. However, on the other hand, this structure would result in a smaller number of contact holes. Since the largeness of the current which flows through the diode element is limited by the number of contact holes, the diode element cannot produce a sufficient outcome with respect to its capacity as a protection device. This especially matters in microstructure processes performed with small contact hole diameters.

SUMMARY OF THE INVENTION

An objective of the present invention is to provide a semiconductor integrated circuit capable of producing a sufficient outcome with respect to its capacity as a protection device while preventing breakage and deterioration in reliability of a diode element.

To achieve the objective, according to the present invention, the resistance between a diffusion layer constituting the anode of the diode element and a substrate or well contact in the vicinity of the diffusion layer is increased as illustrated in FIG. 23 such that the current toward the substrate or well contact is unlikely to flow.

Specifically, a semiconductor integrated circuit of the present invention includes: a diode including a first polarity-type diffusion layer which constitutes an anode of the diode and a second polarity-type diffusion layer which is in the vicinity of the first polarity-type diffusion layer and which constitutes a cathode of the diode; and a second polarity-type substrate or well contact provided around the diode, wherein each of the first polarity-type diffusion layer and second polarity-type diffusion layer of the diode and the substrate or well contact has a plurality of contact holes for electrical connection with an external device, a positioning pitch of the plurality of contact holes of the second polarity-type substrate or well contact is greater than a positioning pitch of the plurality of contact holes of the first polarity-type diffusion layer which constitutes the anode of the diode.

An embodiment of a semiconductor integrated circuit of the present invention includes: a diode including a first polarity-type diffusion layer which constitutes an anode of the diode and a second polarity-type diffusion layer which faces the first polarity-type diffusion layer and which constitutes a cathode of the diode; and a second polarity-type substrate or well contact surrounding four sides of the diode, wherein each of the first polarity-type diffusion layer and second polarity-type diffusion layer of the diode has a plurality of contact holes for electrical connection with an external device, and the substrate or well contact has a plurality of contact holes except for a portion extending parallel to a direction in which the first polarity-type diffusion layer and the second polarity-type diffusion layer face each other.

In one embodiment of a semiconductor integrated circuit of the present invention, the substrate or well contact has the plurality of contact holes only in a portion extending perpendicular to the direction in which the first polarity-type diffusion layer and the second polarity-type diffusion layer face each other.

A semiconductor integrated circuit of the present invention includes: a diode including a first polarity-type diffusion layer which constitutes an anode of the diode and a second polarity-type diffusion layer which faces the first polarity-type diffusion layer and which constitutes a cathode of the diode; and a second polarity-type substrate or well contact formed only by a portion extending perpendicular to a direction in which the first polarity-type diffusion layer and the second polarity-type diffusion layer face each other, wherein each of the first polarity-type diffusion layer and second polarity-type diffusion layer of the diode and the substrate or well contact has a plurality of contact holes for electrical connection with an external device.

A semiconductor integrated circuit of the present invention includes: a diode including a first polarity-type diffusion layer which constitutes an anode of the diode and a second polarity-type diffusion layer which faces the first polarity-type diffusion layer and which constitutes a cathode of the diode; and a second polarity-type substrate or well contact surrounding four sides of the diode, wherein each of the first polarity-type diffusion layer and second polarity-type diffusion layer of the diode and the substrate or well contact has a plurality of contact holes for electrical connection with an external device, a portion of the substrate or well contact extending parallel a direction in which the first polarity-type diffusion layer and the second polarity-type diffusion layer face each other has a greater separation from the first polarity-type diffusion layer or second polarity-type diffusion layer of the diode than a portion of the substrate or well contact extending perpendicular to the facing direction of the diffusion layers.

In one embodiment of a semiconductor integrated circuit of the present invention, a positioning pitch of the plurality of contact holes of the second polarity-type substrate or well contact is greater than a positioning pitch of the plurality of contact holes of the first polarity-type diffusion layer which constitutes the anode of the diode.

In one embodiment of a semiconductor integrated circuit of the present invention, the substrate or well contact has the plurality of contact holes except for a portion extending parallel to the direction in which the first polarity-type diffusion layer and the second polarity-type diffusion layer face each other.

In one embodiment of a semiconductor integrated circuit of the present invention, the substrate or well contact has the plurality of contact holes only in a portion extending perpendicular to the direction in which the first polarity-type diffusion layer and the second polarity-type diffusion layer face each other.

A semiconductor integrated circuit of the present invention includes: a diode including a first polarity-type diffusion layer which constitutes an anode of the diode and a second polarity-type diffusion layer which faces the first polarity-type diffusion layer and which constitutes a cathode of the diode; and a second polarity-type substrate or well contact which shares a diffusion layer with the second polarity-type diffusion layer constituting the cathode of the diode and which surrounds four sides of the diode, wherein each of the first polarity-type diffusion layer and second polarity-type diffusion layer of the diode and the substrate or well contact has a plurality of contact holes for electrical connection with an external device, and a portion of the substrate or well contact extending parallel to a direction in which the first polarity-type diffusion layer and the second polarity-type diffusion layer face each other has a greater separation from the first polarity-type diffusion layer or second polarity-type diffusion layer of the diode than a portion of the substrate or well contact extending perpendicular to the facing direction of the diffusion layers.

In one embodiment of a semiconductor integrated circuit of the present invention, a positioning pitch of the plurality of contact holes of the second polarity-type substrate or well contact is greater than a positioning pitch of the plurality of contact holes of the first polarity-type diffusion layer which constitutes the anode of the diode.

In one embodiment of a semiconductor integrated circuit of the present invention, the substrate or well contact has the plurality of contact holes except for a portion extending parallel to the direction in which the first polarity-type diffusion layer and the second polarity-type diffusion layer face each other.

In one embodiment of a semiconductor integrated circuit of the present invention, the substrate or well contact has the plurality of contact holes only in a portion extending perpendicular to the direction in which the first polarity-type diffusion layer and the second polarity-type diffusion layer face each other.

In one embodiment of a semiconductor integrated circuit of the present invention, the number of contact holes formed in the first polarity-type diffusion layer which constitutes the anode of the diode is equal to the number of contact holes formed in the second polarity-type diffusion layer which shares a diffusion layer with the second polarity-type substrate or well contact and which constitutes the cathode of the diode.

A semiconductor integrated circuit of the present invention includes: a diode including a first polarity-type diffusion layer which constitutes an anode of the diode and a second polarity-type diffusion layer which is in the vicinity of the first polarity-type diffusion layer and which constitutes a cathode of the diode; and a second polarity-type substrate or well contact, wherein the second polarity-type diffusion layer which constitutes the cathode of the diode substitutes for the second polarity-type substrate or well contact.

In one embodiment of a semiconductor integrated circuit of the present invention, each of the first polarity-type diffusion layer of the diode and the second polarity-type diffusion layer of the diode which substitutes for the substrate or well contact has a plurality of contact holes for electrical connection with an external device, and the number of contact holes formed in the first polarity-type diffusion layer of the diode is equal to the number of contact holes formed in the second polarity-type diffusion layer of the diode which substitutes for the substrate or well contact.

In one embodiment of a semiconductor integrated circuit of the present invention, the first polarity-type diffusion layer which constitutes the anode of the diode and the second polarity-type diffusion layer which constitutes the cathode of the diode have the shape of a rectangular strip.

In one embodiment of a semiconductor integrated circuit of the present invention, the second polarity-type diffusion layer which constitutes the cathode of the diode is provided on both left and right sides of the first polarity-type diffusion layer which constitutes the anode of the diode.

A system LSI of the present invention includes: a digital circuit and an analog circuit which operate on separate power supplies; and a single unit of protection device formed by two aforementioned semiconductor integrated circuits and provided between the digital circuit and the analog circuit for allowing electrostatic discharge from the digital circuit to the analog circuit and electrostatic discharge from the analog circuit to the digital circuit.

Thus, in a semiconductor integrated circuit and system LSI of the present invention, the resistance value between a diffusion layer which constitutes the anode of the diode element and a substrate or well contact is increased. Accordingly, the current flowing from the diffusion layer which constitutes the anode of the diode element to the substrate or well contact decreases, and convergence of the current at contact holes formed in the anode is reduced. As a result, breakage and deterioration in reliability of the diode element can be effectively prevented. Further, the shape of the diffusion layer which constitutes the anode does not need to be additionally processed, for example, by truncation of four corners. Thus, it is not necessary to decrease the number of contact holes formed in the diffusion layer of the anode. Therefore, a sufficient outcome with respect to its capacity as a protection device can be produced.

Especially, according to the present invention, the number of contact holes formed in the substrate or well contact does not need to be more than necessary. Thus, production becomes easy.

According to the present invention, in the diode, the current from the diffusion layer which constitutes the anode flows toward a diffusion layer of the cathode which faces the diffusion layer of the anode and also flows toward a portion of the substrate or well contact which extends parallel to the facing direction of the diffusion layers. However, this portion of the substrate or well contact has a greater separation from the diffusion layers, so that the current is unlikely to flow toward this portion. Herein, a portion of the substrate or well contact extending perpendicular to a direction in which the diffusion layers of the anode and cathode face each other has a smaller separation from the diffusion layer in the facing direction. Therefore, the area of the semiconductor integrated circuit is small as compared with a case where this separation in the facing direction is as large as the separation in the perpendicular direction, and hence, the size of the semiconductor integrated circuit is decreased.

Further, according to the present invention, the diffusion layer which constitutes the cathode of the diode share a diffusion layer with the substrate or well contact. Therefore, the space which occurs between the diffusion layer of the cathode and the substrate or well contact in the case where the diffusion layer is not shared can be reduced. Accordingly, the area of the semiconductor integrated circuit is decreased, and the size of the semiconductor integrated circuit is also decreased.

In addition, according to the present invention, the diffusion layer which constitutes the cathode of the diode substitutes for the substrate or well contact. Therefore, the substrate or well contact is not necessary. Accordingly, the area of the semiconductor integrated circuit is decreased, and the size of the semiconductor integrated circuit is also decreased.

DESCRIPTION OF THE PREFERRED EMBODIMENTS

Hereinafter, examples of the present invention will be described with reference to the drawings.

EXAMPLE 1

Figure 20:
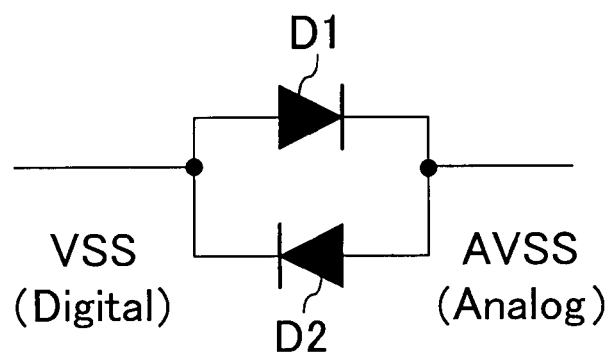
FIG. 20 shows a place where a semiconductor integrated circuit of the present invention is applied.

Hereinafter, a semiconductor integrated circuit according to Example 1 of the present invention is described with reference to FIG. 1. The place where the semiconductor integrated circuit of Example 1 as a protection device is applied is as previously described with reference to FIG. 20, and therefore, the detailed description thereof is herein omitted.

Figure 1:
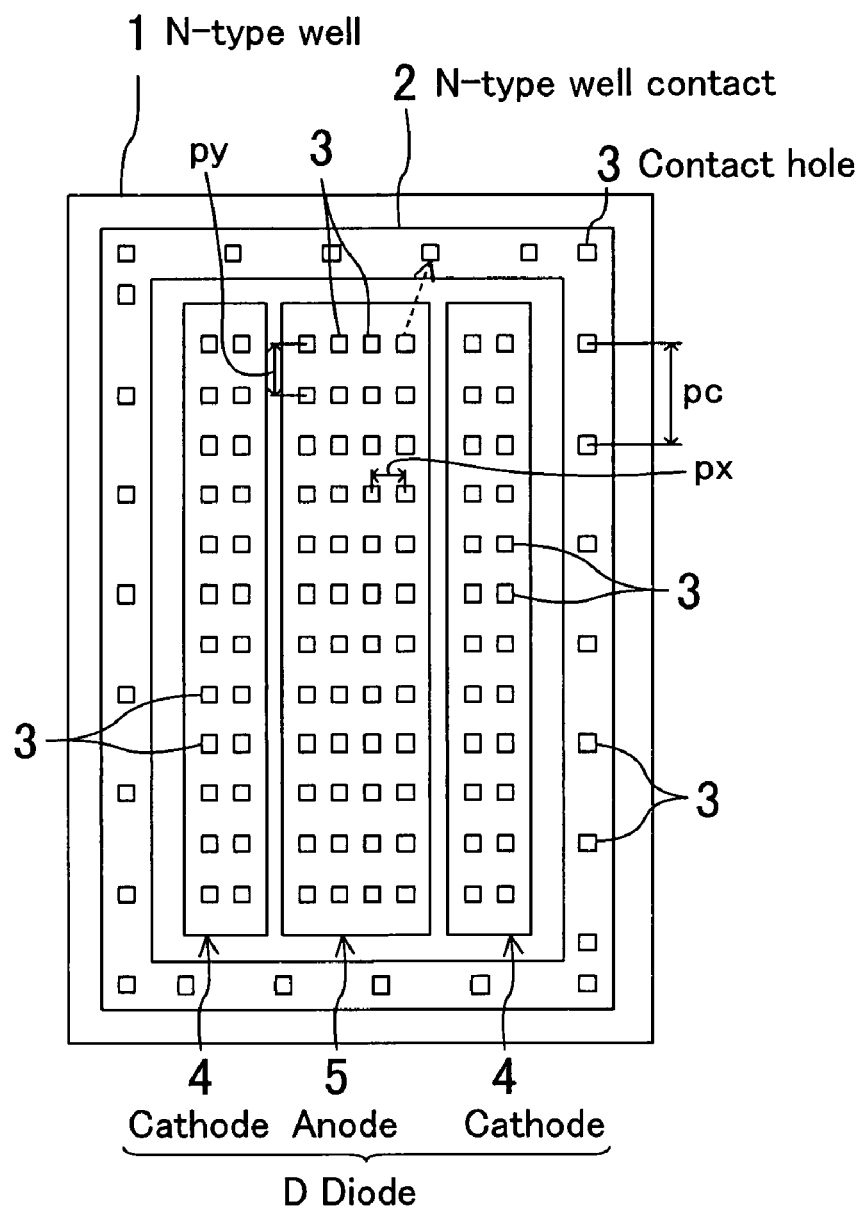
FIG. 1 shows a layout structure of a semiconductor integrated circuit according to Example 1 of the present invention.
Figure 2:
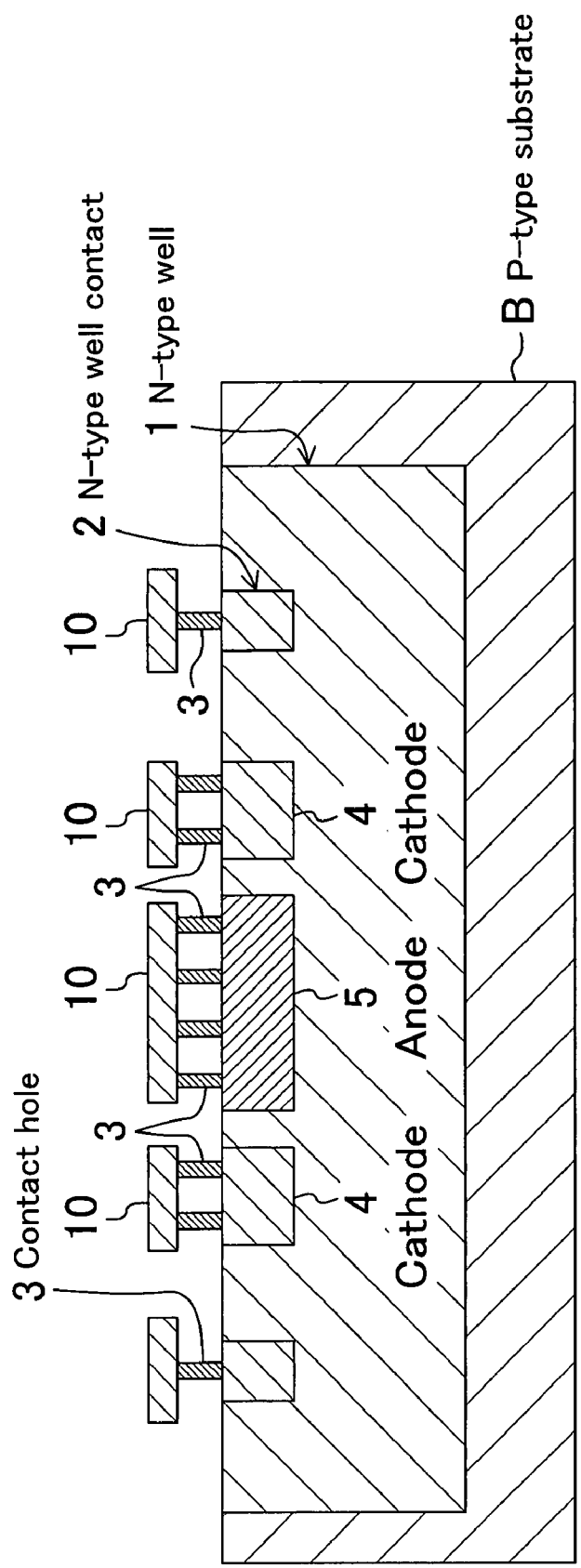
FIG. 2 is a cross-sectional view of the semiconductor integrated circuit of Example 1.

FIG. 1 and FIG. 2 show the semiconductor integrated circuit of Example 1. These drawings show a P-type (first polarity type) substrate B (shown only in FIG. 2) and an N-type (second polarity type) well 1 which is provided on the P-type substrate B. In the N-type well 1, a P-type diffusion layer (first polarity type diffusion layer) 5 which constitutes the anode is provided, and two N-type diffusion layers (second polarity type diffusion layers) 4 which constitute the cathode are adjacently provided on opposite sides of the P-type diffusion layer 5 (on the left and right sides in the drawings). These diffusion layers 4 and 5 constitute a diode D. The P-type diffusion layer 5 which constitutes the anode and the N-type diffusion layers 4 which constitute the cathode are each has the shape of a rectangular strip in these drawings.

In the N-type well 1, an N-type (second polarity type) well contact 2 having the shape of a rectangular frame surrounding the four sides of the diode D is provided. The well contact 2 is provided for the purposes of preventing leakage of noise from the anode or cathode to the outside and preventing latch-up.

The diffusion layers 4 and 5 of the diode D and the well contact 2 have a large number of contact holes 3 over the entire region of each diffusion layer for connection with the outside and are connected from the contact holes 3 to the power supply or other semiconductor elements via signal lines 10 shown in FIG. 2. In the P-type diffusion layer 5 which constitutes the anode, the positioning pitches of the contact holes 3 are "px" horizontally in the drawings and "py" vertically in the drawings (py>px). On the other hand, in the N-type well 2, the positioning pitch of the contact holes 3 is a setting pitch "pc". The setting pitch "pc" is greater than the maximum pitch of the contact holes 3 in the P-type diffusion layer 5 which constitutes the anode, i.e., the vertical positioning pitch "py" (pc>py). It should be noted that the largeness of the current flowing through the diode D is determined by the number of contact holes 3 formed in the diffusion layers 5 and 4 which constitute the anode and cathode. The shape of a rectangular strip is advantageous in determining the number of contact holes 3 to be provided. For example, if the number of contact holes 3 in the column direction is constant, the largeness of the current can be readily determined by changing the number of contact holes 3 in the row direction.

Figure 21:
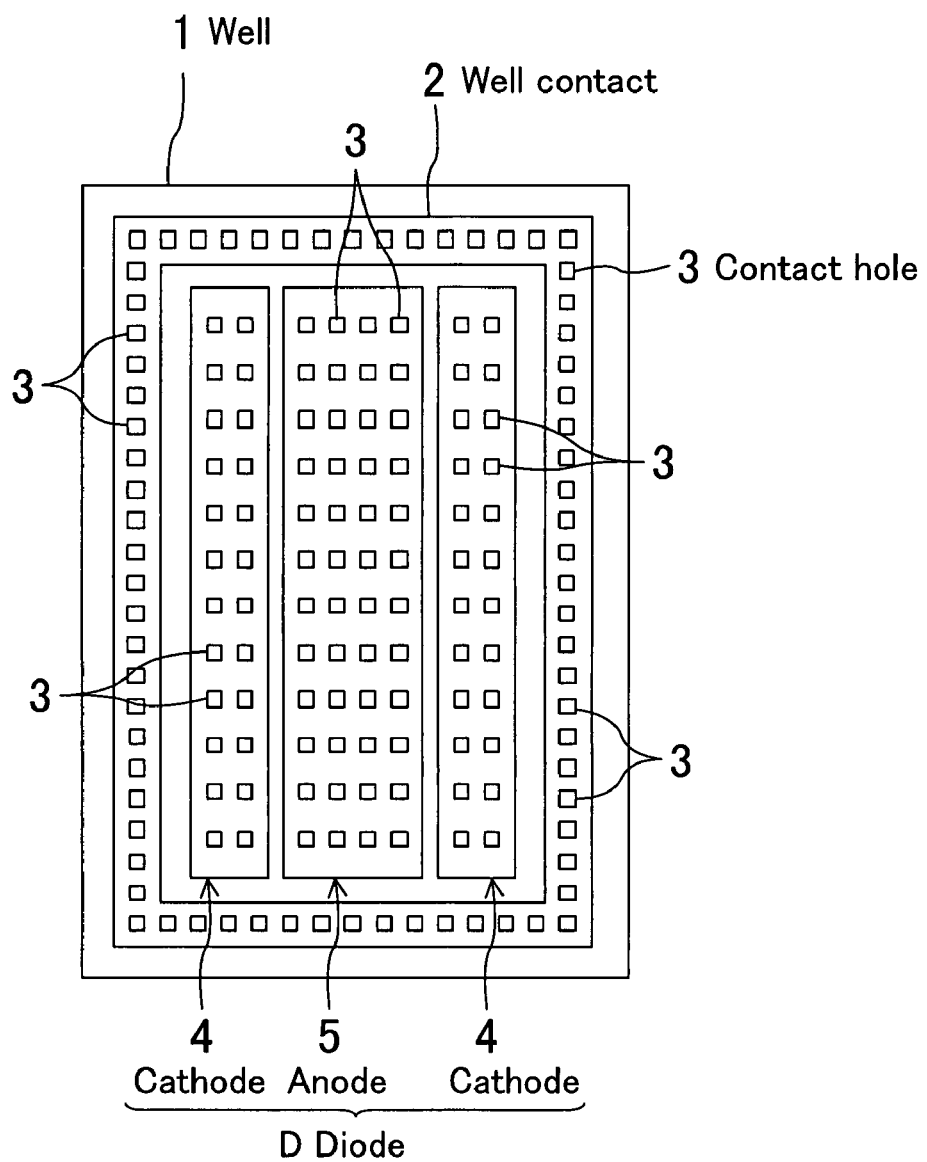
FIG. 21 shows a proposed example of a semiconductor integrated circuit.
Figure 22:
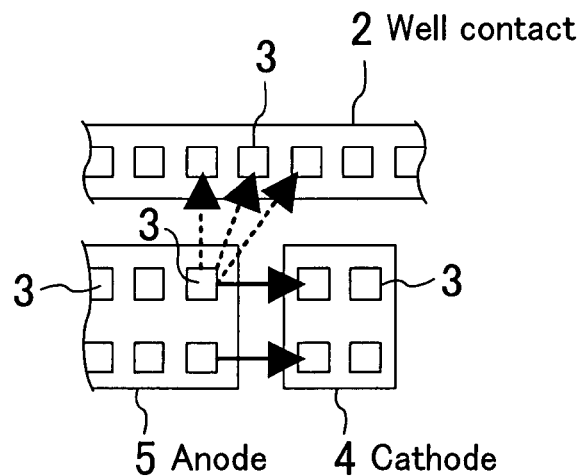
FIG. 22 is a schematic view illustrating the flow of currents in the layout structure of the semiconductor integrated circuit of the proposed example of FIG. 21.
Figure 23:
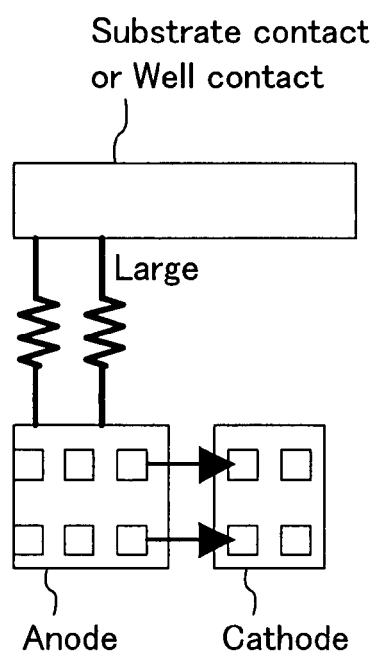
FIG. 23 is a schematic view illustrating the flow of currents in the layout structure of a semiconductor integrated circuit of the present invention.

Therefore, in Example 1, the number of contact holes 3 formed in the N-type well 2 is small as compared with the proposed example shown in FIG. 21. As a result, the number of contact holes 3 of the N-type well 2 which are in the vicinity of the contact holes 3 formed along the edges of the P-type diffusion layer 5 which constitutes the anode is small, and the distance between the contact holes 3 of the N-type well 2 and the vicinal contact holes 3 of the P-type diffusion layer 5 is long. Accordingly, the value of resistance to the vicinal contact holes 3 is larger than the conventional resistance value. Therefore, as illustrated by an broken arrow in FIG. 1, the current flowing from the contact holes 3 of the P-type diffusion layer 5 which constitutes the anode to a vicinal contact hole 3 of the N-type well contact 2 is restricted. Thus, convergence of the current at the contact holes 3 of the P-type diffusion layer 5 of the anode which are in the vicinity of the well contact 2 is reduced. Hence, breakage and deterioration in reliability of the diode D can be effectively prevented.

In Example 1, the well 1 is of N-type, the diffusion layer 5 which constitutes the anode is of P-type, and the diffusion layers 4 which constitute the cathode are of N-type, but the present invention is not limited thereto. Alternatively, for example, the conduction type of the well 1 may be P-type. In this case, the anode and the cathode are replaced by each other. Specifically, an N-type diffusion layer 4 which constitute the cathode is placed at the center, while two P-type diffusion layers 5 which constitute the anode are provided on the left and right sides of the diffusion layer 4, so that currents flow from the anode provided on the left and right sides to the cathode provided at the center.

Figure 3:
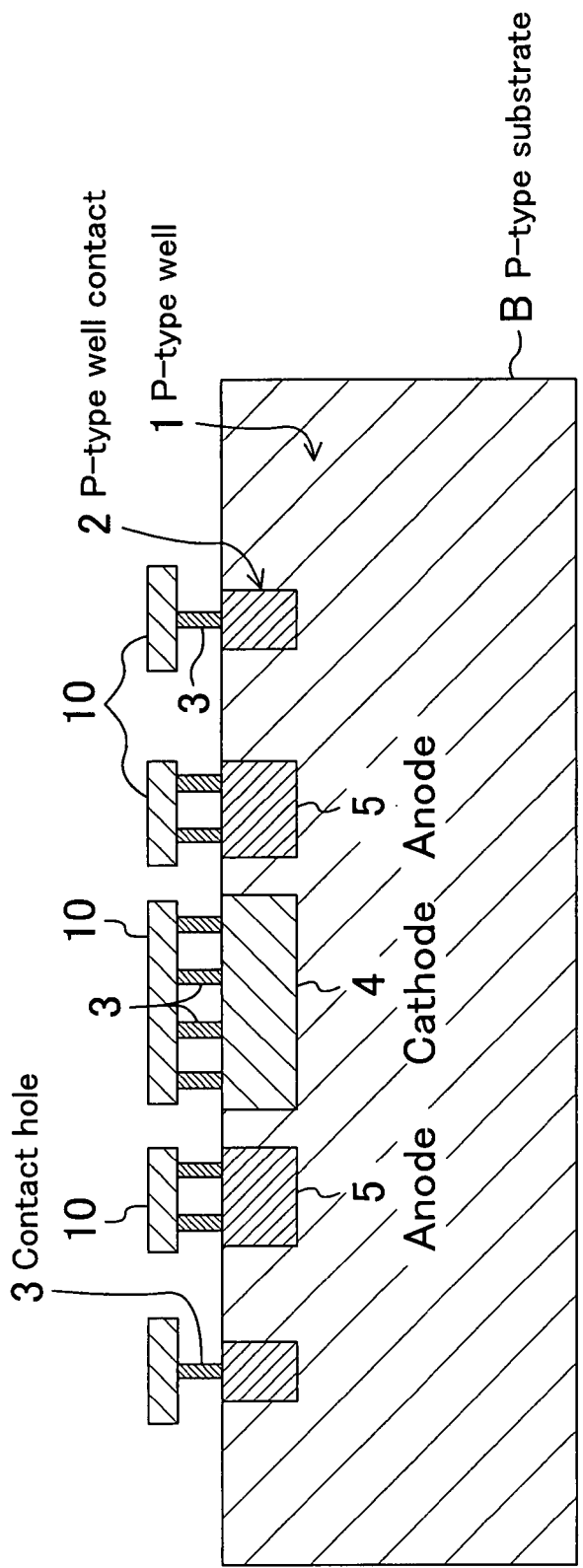
FIG. 3 is a cross-sectional view of an alternative example of the semiconductor integrated circuit of Example 1.

Although in Example 1 the substrate B has the well 1, the present invention is, as a matter of course, applicable to a substrate which does not have the well 1. In this case, as illustrated in FIG. 3, if the substrate B is of P-type, an N-type diffusion layer 4 which constitute the cathode is placed at the center, while two P-type diffusion layers 5 which constitute the anode are provided on the left and right sides of the diffusion layer 4.

The conduction type of the diffusion layer(s) which constitutes the anode and the diffusion layer(s) which constitutes the cathode may be changed variously so long as any one of the anode and cathode diffusion layers is of N-type while the other is of P-type. Further, the conduction type of any one of the anode and the cathode may be appropriately selected according to the conduction type of the well 2 or the conduction type of the substrate B. In addition, as a matter of course, the shape of the diffusion layers 4 and 5 constituting the anode and cathode is not limited to the rectangular strip. These notes also apply to the following descriptions.

(Variation 1 of Example 1)

Figure 4:
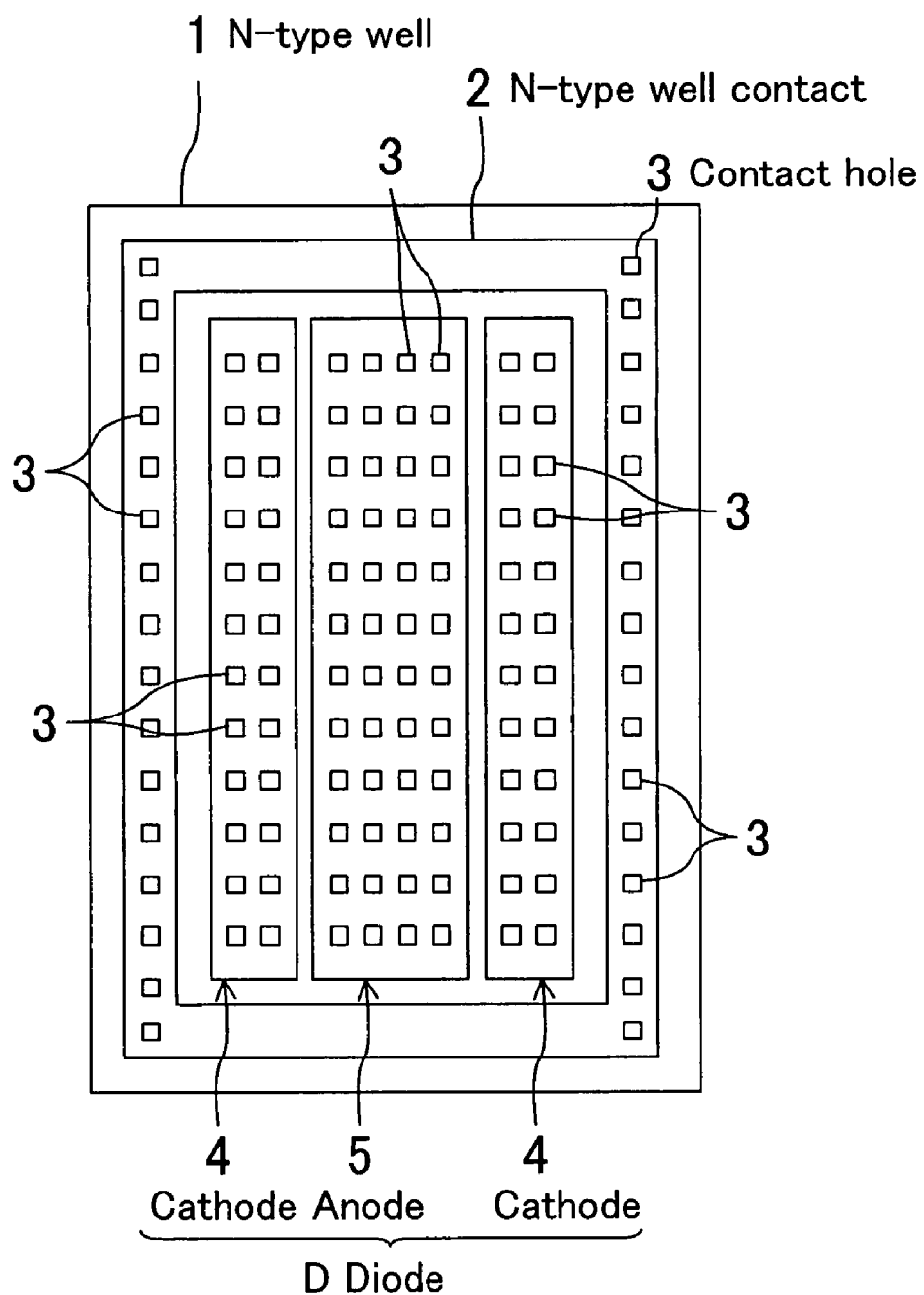
FIG. 4 shows a layout structure of a semiconductor integrated circuit according to Variation 1 of Example 1.

FIG. 4 shows Variation 1 of Example 1.

In Variation 1 of Example 1, as shown in FIG. 4, portions of the N-type well contact 2 extending parallel to a direction in which a P-type diffusion layer 5 constituting the anode and two diffusion layers 4 constituting the cathode face one another, i.e., the shorter side portions of the N-type well contact 2, do not have the contact holes 3.

Thus, in Variation 1 of Example 1, the distance between the contact holes 3 of the P-type diffusion layer 5 which constitutes the anode and the vicinal contact holes 3 of the N-type well contact 2 is greater than that of Example 1. Therefore, the resistance value against the vicinal contact holes 3 is larger than that of Example 1. Thus, convergence of the current at contact holes 3 of the P-type diffusion layer 5 of the anode which are in the vicinity of the well contact 2 is reduced. Hence, breakage and deterioration in reliability of the diode D can be effectively prevented.

(Variation 2 of Example 1)

Figure 5:
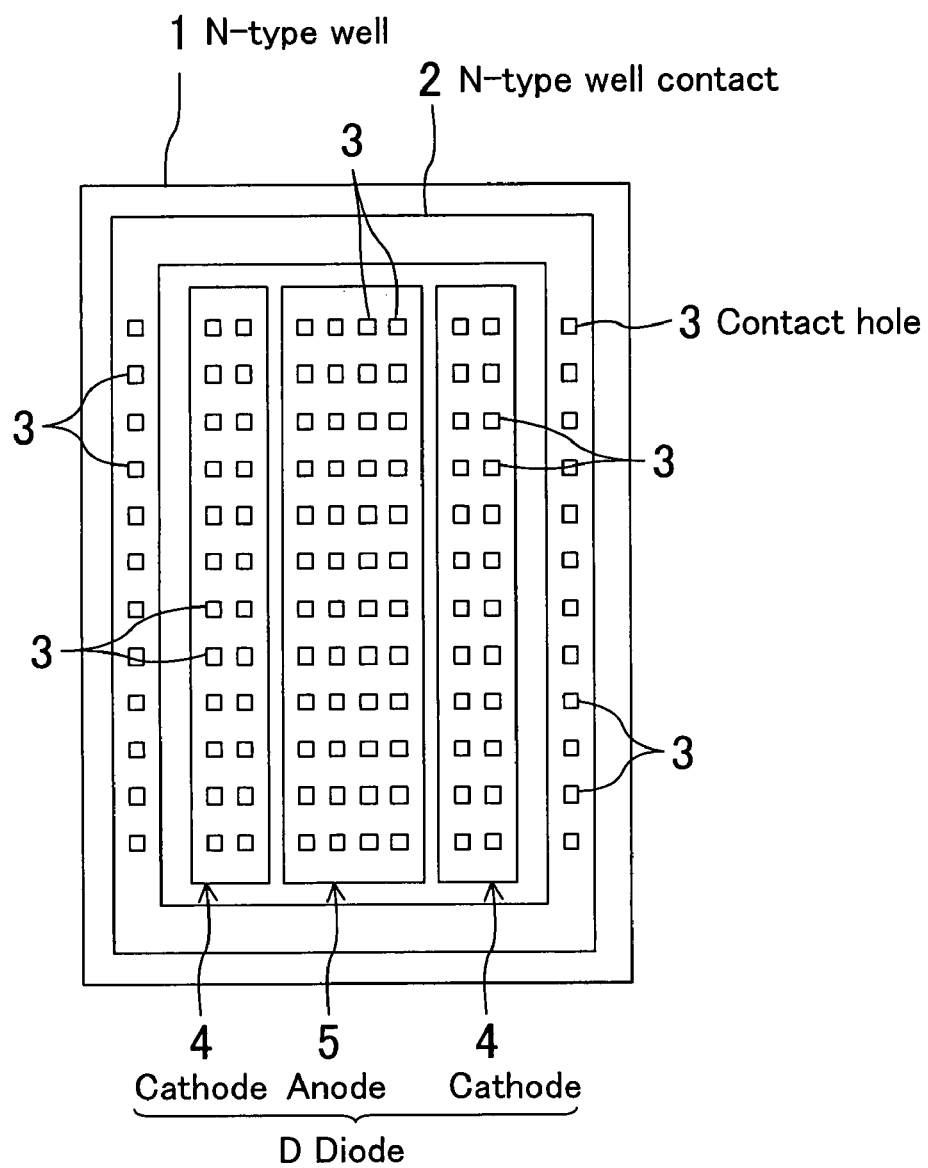
FIG. 5 shows a layout structure of a semiconductor integrated circuit according to Variation 2 of Example 1.

FIG. 5 shows Variation 2 of Example 1.

In Variation 2 of Example 1, as shown in FIG. 5, only portions of the N-type well contact 2 which face the longer sides of the diffusion layers 4 which constitute the cathode have the contact holes 3. In Variation 2 of Example 1, the positioning pitch of the contact holes 3 of the well contact 2 is equal to that of the contact holes 3 of the diffusion layers 4 which constitute the cathode. Therefore, the contact holes 3 of the well contact 2 are equal in number to, and are positioned to face, the contact holes 3 of the diffusion layers 4 which constitute the cathode.

Variation 2 of Example 1 is different from the semiconductor integrated circuit of FIG. 4 in that the contact holes 3 are not provided in the four corners of the rectangular well contact 2. Therefore, a current from the diffusion layer 5 which constitutes the anode flows horizontally in the drawing to reach the diffusion layers 4 which constitute the cathode provided on the sides of the diffusion layer 5. Thus, the current flowing from the diffusion layer 5 of the anode to the well contact 2 is further restricted, so that convergence of the current at contact holes 3 of the diffusion layer 5 of the anode which are in the vicinity of the well contact 2 is reduced. Hence, breakage and deterioration in reliability of the diode element can be effectively prevented.

Figure 6:
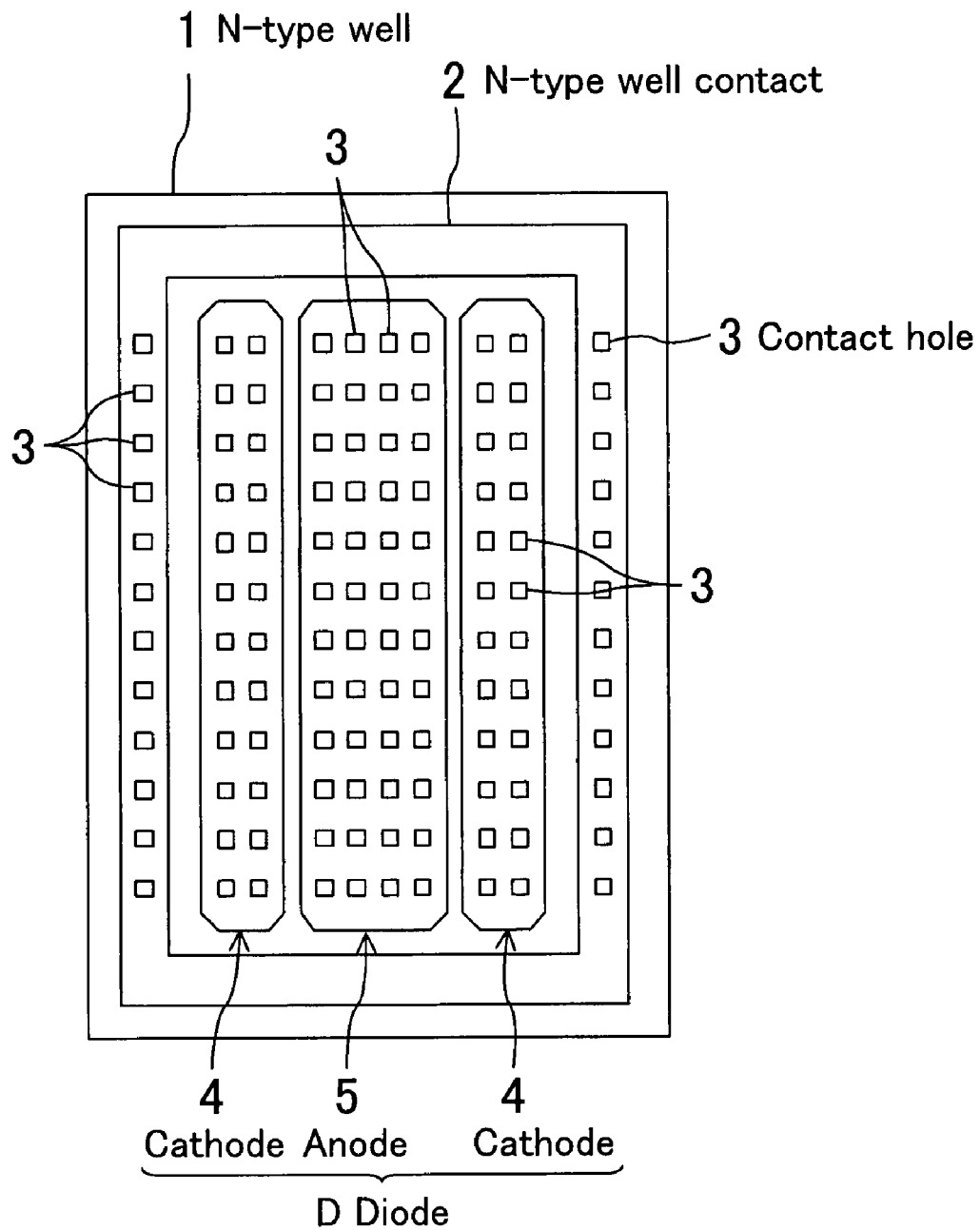
FIG. 6 shows a layout structure of a modified version of the semiconductor integrated circuit according to Variation 2 of Example 1.

In the above descriptions, the diffusion layers 4 and 5 of the diode D have the shape of a rectangular strip, but the present invention is not limited thereto. For example, as a matter of course, the four corners of the strip-shaped diffusion layers 4 and 5 may be slightly truncated as illustrated in FIG. 6.

(Variation 3 of Example 1)

Figure 7:
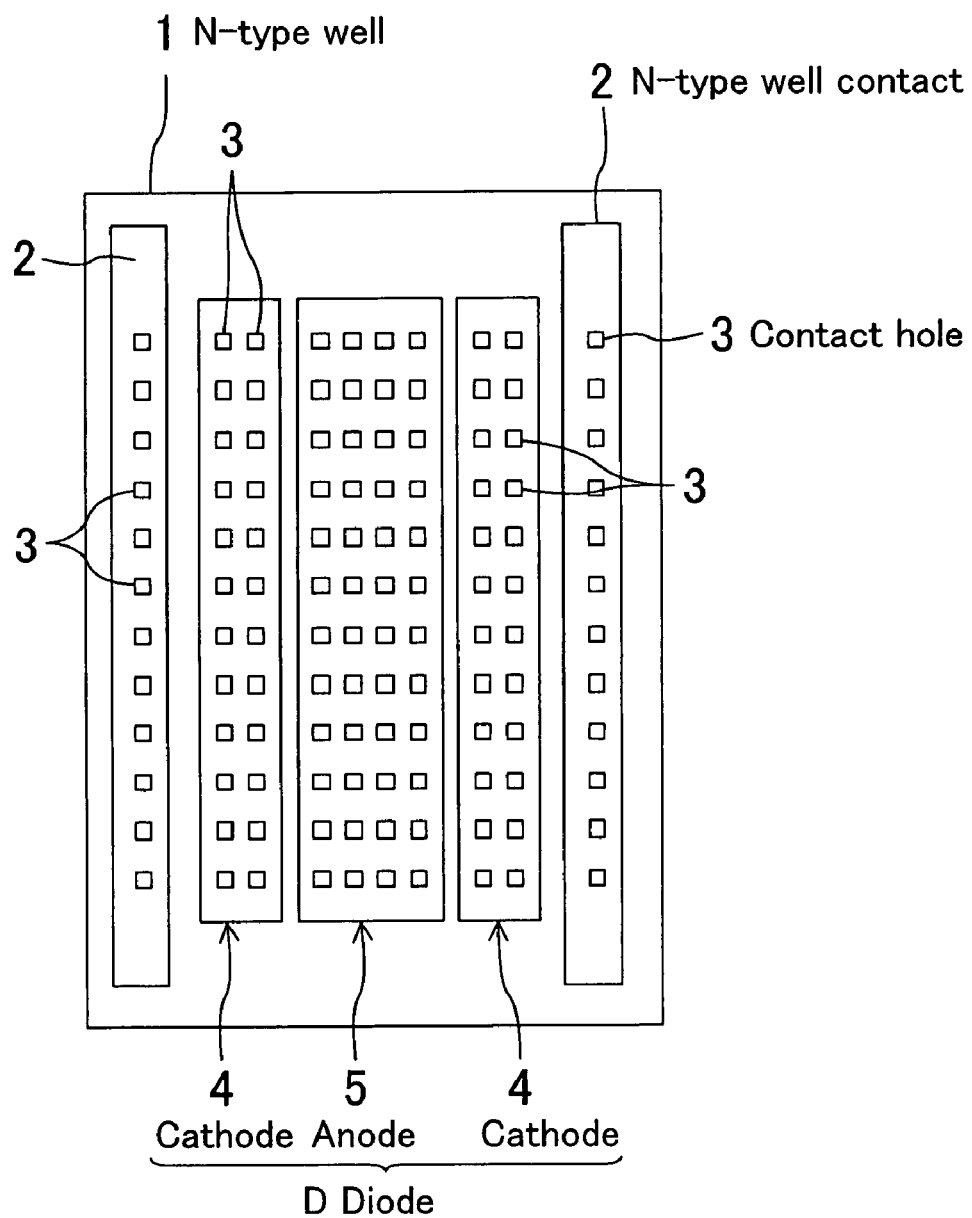
FIG. 7 shows a layout structure of a semiconductor integrated circuit according to Variation 3 of Example 1.

FIG. 7 shows Variation 3 of Example 1.

In Variation 3 of Example 1, the well contact 2 having the shape of a rectangular frame has a plurality of contact holes 3 only in portions which face the longer sides of the diffusion layers 4 constituting the cathode. Thus, as seen from FIG. 5 and FIG. 6, the upper and lower sides of the rectangular well contact 2 do not have the contact holes 3. In view of this, according to Variation 3 of Example 1, as illustrated in FIG. 7, the upper and lower sides of the rectangular well contact 2 which do not have the contact holes 3 are removed, such that the well contact 2 is formed only by the left and right side portions which face the longer sides of the diffusion layers 4 constituting the cathode. In Variation 3 of Example 1, the same functions and effects as those of Variation 2 of Example 1 are achieved.

EXAMPLE 2

Next, a semiconductor integrated circuit according to Example 2 of the present invention is described with reference to FIG. 8.

Figure 8:
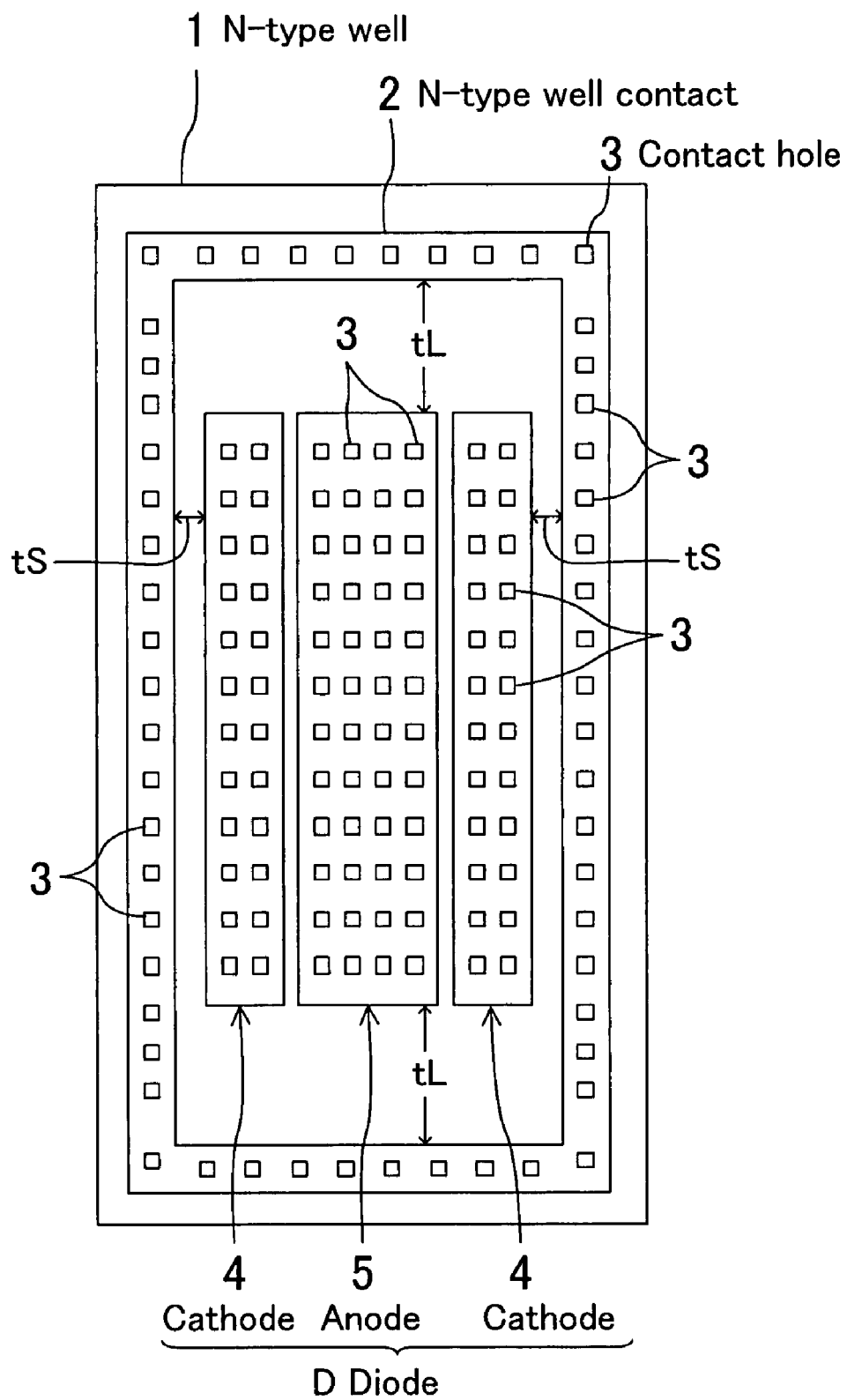
FIG. 8 shows a layout structure of a semiconductor integrated circuit according to Example 2 of the present invention.

As shown in FIG. 8, the structure of Example 2 is the same as the structure of FIG. 1 in that a P-type diffusion layer 5 which constitutes the anode of a diode D is provided at the center, while two diffusion layers 4 which constitute the cathode are provided on the left and right sides of the anode, and that the diode D is surrounded by a well contact 2.

In Example 2, portions of the well contact 2 extending parallel to a direction in which the diffusion layer 5 constituting the anode and the two diffusion layers 4 constituting the cathode face one another, i.e., the shorter side portions of the well contact 2, has a greater separation from the diffusion layers 4 and 5 of the anode and cathode (separation tL) than portions of the rectangular well contact 2 extending perpendicular to the direction in which the diffusion layer 5 of the anode and the diffusion layers 4 of the cathode face one another, i.e., the longer side portions of the well contact 2.

The positioning pitch of the contact holes 3 formed in the rectangular well contact 2 is equal to that of the contact holes 3 formed in the diffusion layers 4 and 5 of the anode and cathode.

In Example 2, separation tL between the diffusion layers 4 and 5 of the anode and cathode and the shorter side portions of the well contact 2 is longer than separation tS between the diffusion layers 4 of the cathode and the longer side portions of the well contact 2 (tL>tS). With this structure, the resistance value between the diffusion layer 5 of the anode and the shorter side portions of the well contact 2 is large. Thus, the current flowing from the diffusion layer 5 of the anode to the shorter side portions of the well contact 2 is restricted, so that convergence of the current at contact holes 3 formed along the edges of the diffusion layer 5 of the anode which are in the vicinity of the well contact 2 is reduced. As a result, breakage and deterioration in reliability of the diode D can be effectively prevented.

Figure 9:
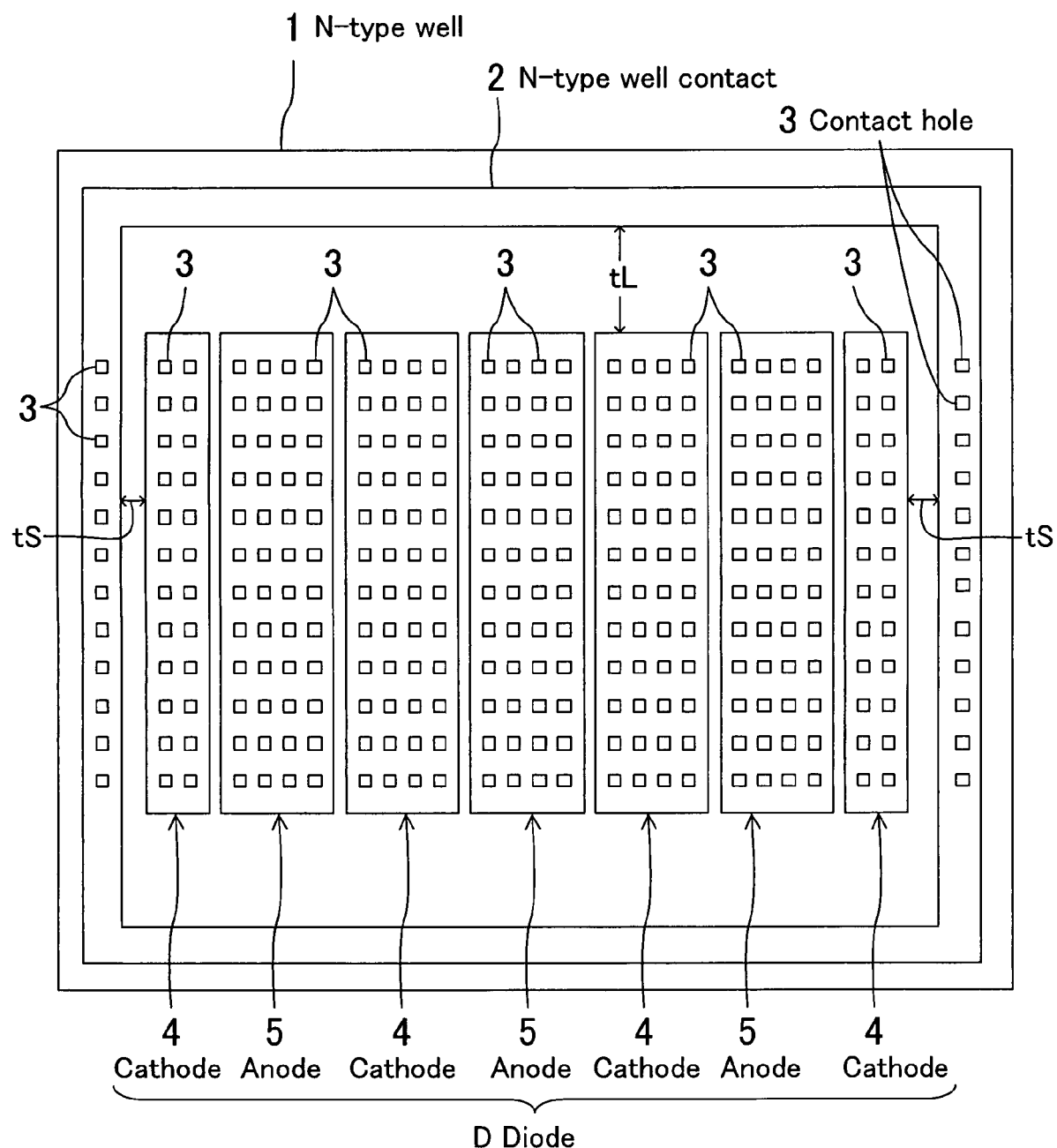
FIG. 9 shows a layout structure of a modified version of the semiconductor integrated circuit according to Example 2.

In the above description, the diode D is formed by the diffusion layer 5 of the anode at the center and the two diffusion layers 4 of the cathode which are provided on the left and right sides of the diffusion layer 5, but the present invention is not limited to this arrangement. Various other diode configurations are employable. For example, as illustrated in the semiconductor integrated circuit shown in FIG. 9, the diode D may have three diffusion layers 5 of the anode and four diffusion layers 4 of the cathode such that the diffusion layers 5 of the anode are provided alternately between the four diffusion layers 4 of the cathode. This also applies to the following descriptions.

(Variation 1 of Example 2)

Figure 10:
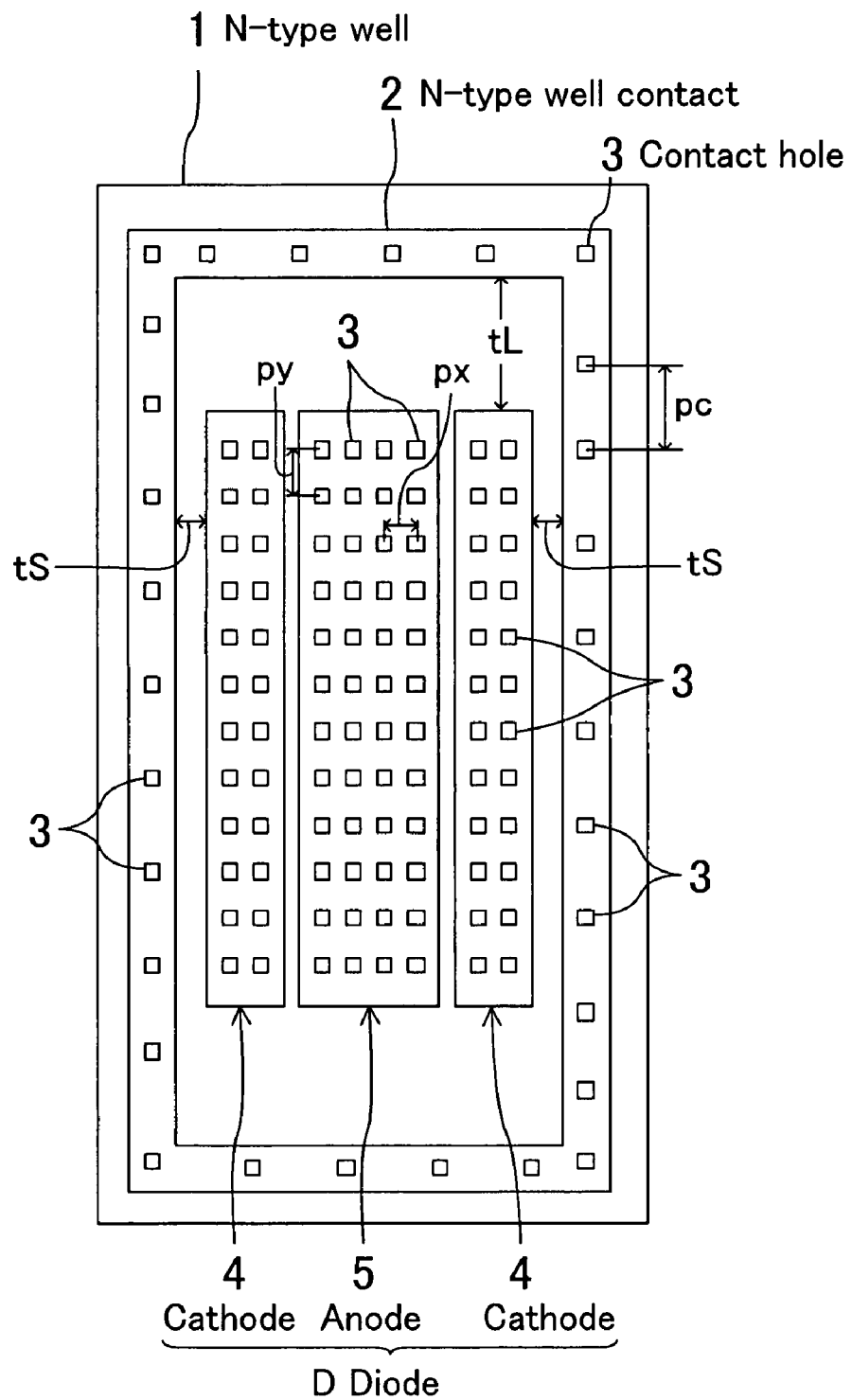
FIG. 10 shows a layout structure of a semiconductor integrated circuit according to Variation 1 of Example 2.

FIG. 10 shows Variation 1 of Example 2.

In Variation 1 of Example 2, separation tL between the shorter side portions of the well contact 2 and the diffusion layers 5 and 4 of the anode and cathode is longer than separation tS between the longer side portions of the well contact 2 and the diffusion layers 4 of the cathode as in Example 2. In addition, as in Example 1, the positioning pitch of the contact holes 3 formed in the well contact 2, "pc", is greater than the maximum pitch of the contact holes 3 of the P-type diffusion layer 5 which constitutes the anode, i.e., the vertical positioning pitch "py" (pc>py) as shown in FIG. 10.

Therefore, Variation 1 of Example 2 provides the functions and effects of Example 1 in addition to those of Example 2.

(Variation 2 of Example 2)

Figure 11:
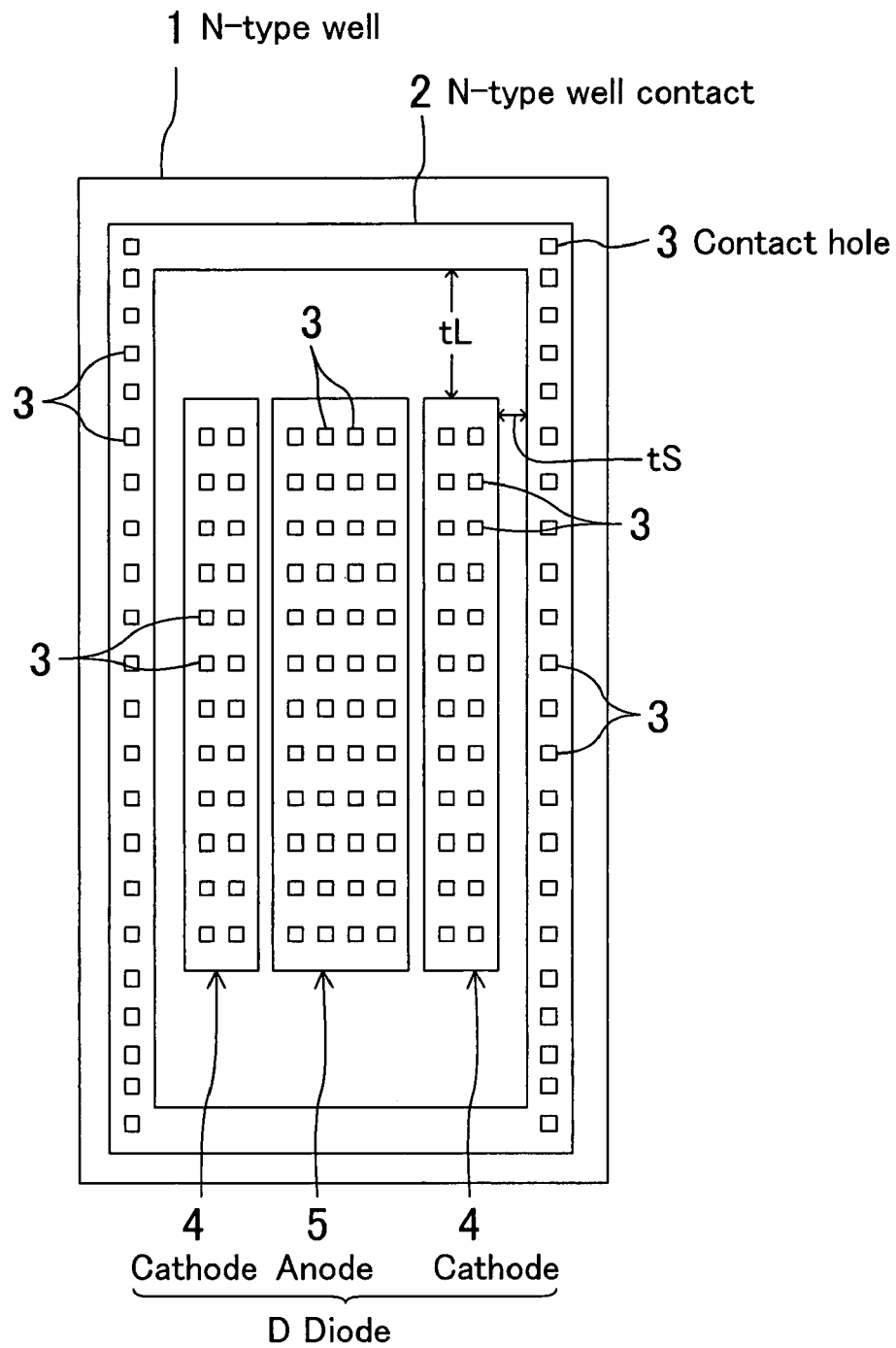
FIG. 11 shows a layout structure of a semiconductor integrated circuit according to Variation 2 of Example 2.

FIG. 11 shows Variation 2 of Example 2.

In Variation 2 of Example 2, separation tL between the shorter side portions of the well contact 2 and the diffusion layers 5 and 4 of the anode and cathode is longer than separation tS between the longer side portions of the well contact 2 and the diffusion layers 4 of the cathode as in Example 2. In addition, as in Variation 1 of Example 1, the shorter side portions of the N-type well contact 2 (i.e., portions of the N-type well contact 2 extending parallel to a direction in which the P-type diffusion layer 5 constituting the anode and the two diffusion layers 4 constituting the cathode face one another) do not have the contact holes 3 as shown in FIG. 11. It should be noted that, in FIG. 11, the positioning pitch of the contact holes 3 formed in the longer side portions of the well contact 2 is equal to the maximum pitch of the contact holes 3 of the P-type diffusion layer 5 which constitutes the anode (vertical positioning pitch).

Therefore, Variation 2 of Example 2 provides the functions and effects of Variation 1 of Example 1 in addition to those of Example 2.

(Variation 3 of Example 2)

Figure 12:
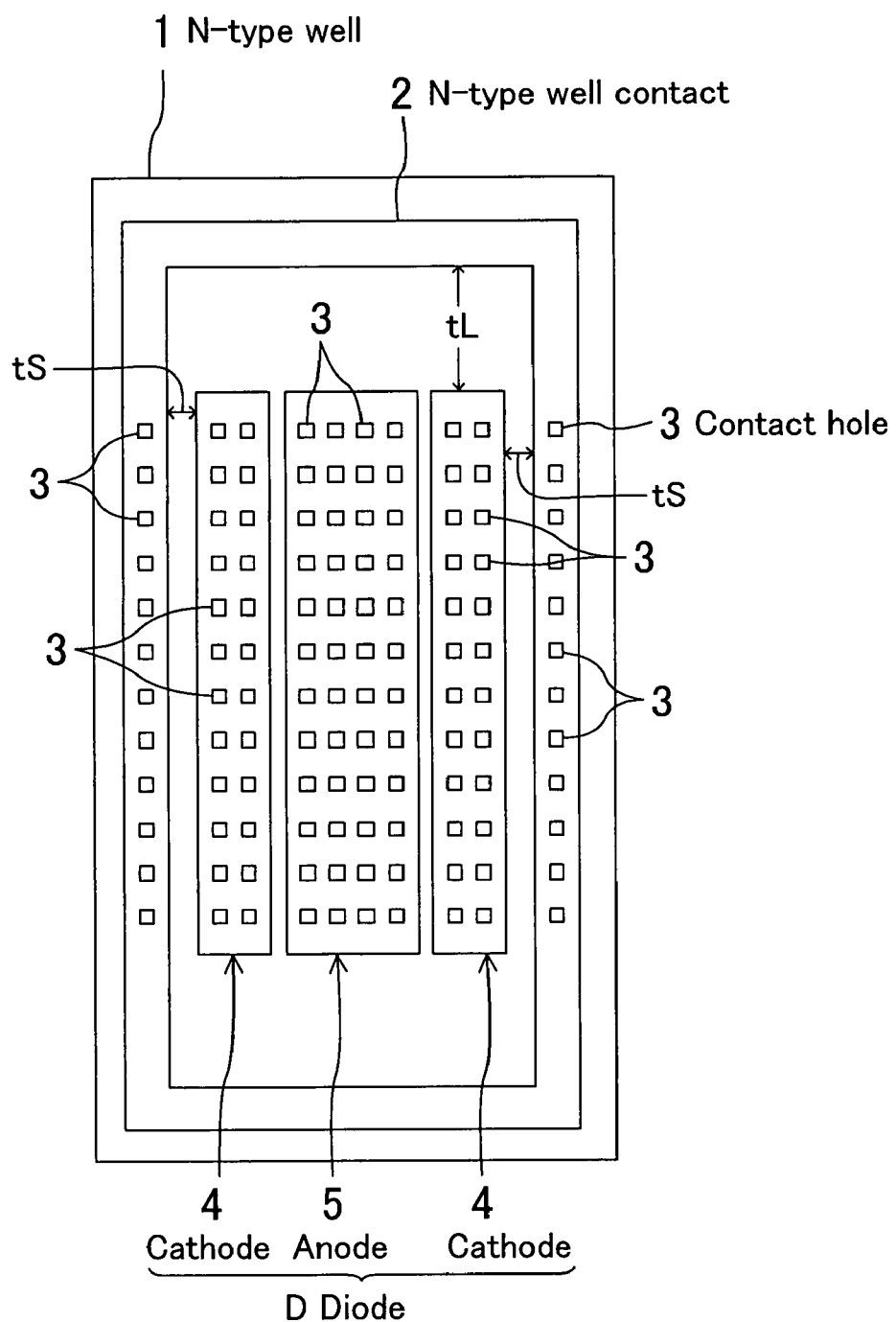
FIG. 12 shows a layout structure of a semiconductor integrated circuit according to Variation 3 of Example 2.

FIG. 12 shows Variation 3 of Example 2.

In Variation 3 of Example 2, separation tL between the shorter side portions of the well contact 2 and the diffusion layers 5 and 4 of the anode and cathode is longer than separation tS between the longer side portions of the well contact 2 and the diffusion layers 4 of the cathode as in Example 2. In addition, as in Variation 2 of Example 1, the well contact 2 has a plurality of contact holes 3 only in portions which face the longer sides of the diffusion layers 4 constituting the cathode.

Therefore, Variation 3 of Example 2 provides the functions and effects of Variation 2 of Example 1 in addition to those of Example 2.

Although in Variation 3 of Example 2 the well contact 2 has the shape of a rectangular frame, the shorter side portions of the well contact 2 may be omitted as in FIG. 7 because the shorter side portions do not have the contact holes 3.

EXAMPLE 3

Next, a semiconductor integrated circuit according to Example 3 of the present invention is described with reference to FIG. 13.

Figure 13:
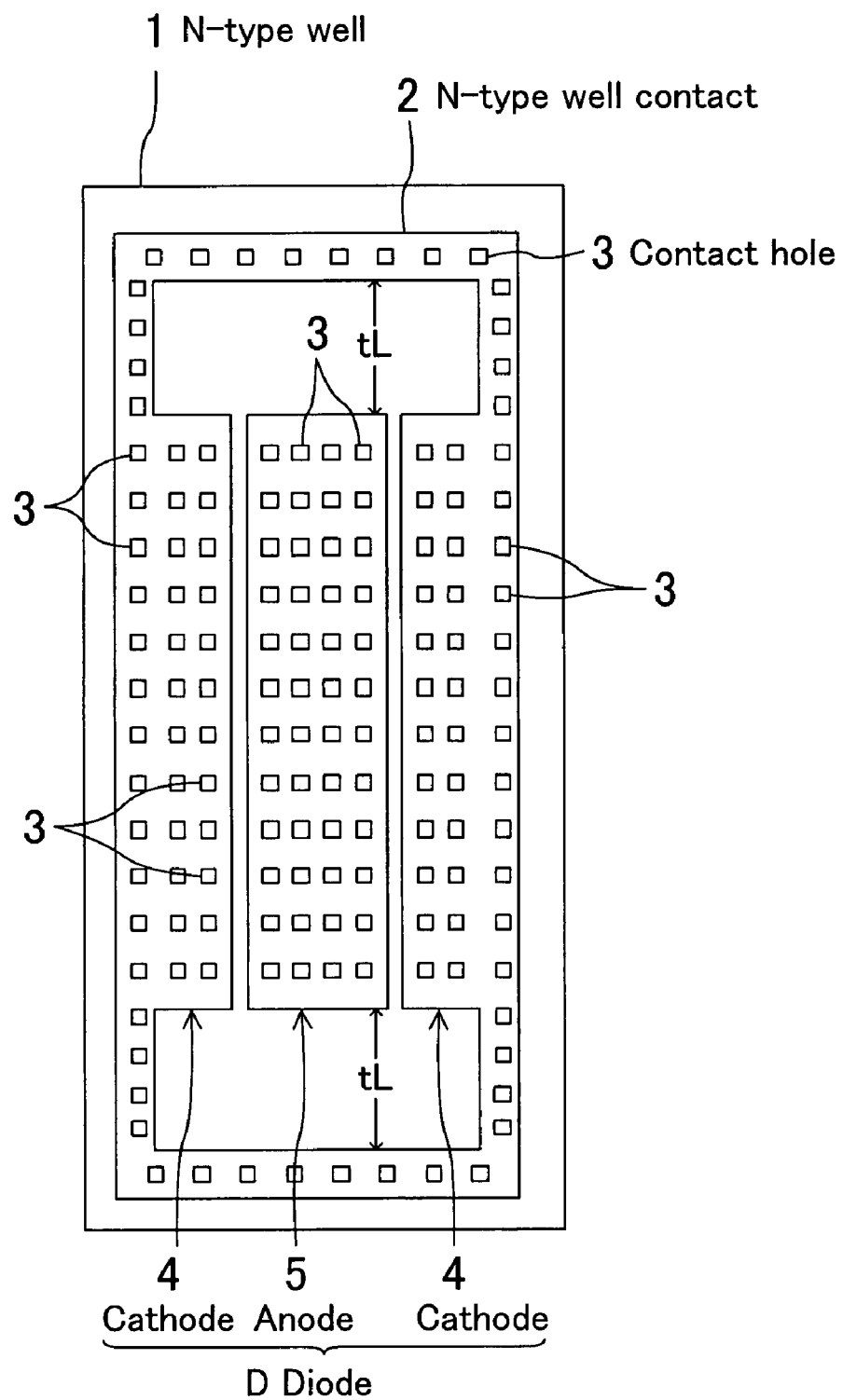
FIG. 13 shows a layout structure of a semiconductor integrated circuit according to Example 3 of the present invention.

As shown in FIG. 13, the structure of Example 3 is the same as the structure of FIG. 1 in that a P-type diffusion layer 5 which constitutes the anode of a diode D is provided at the center, while two N-type diffusion layers 4 which constitute the cathode are provided on the left and right sides of the diffusion layer 5 of the anode, and that the diode D is surrounded by a well contact 2.

In Example 3, the rectangular well contact 2 is not separate from but shares a diffusion layer with the two N-type diffusion layers 4 which constitute the cathode. With this structure, the potential of the two N-type diffusion layers 4 which constitute the cathode of the diode D is equal to the potential of the well contact 2.

In Example 3, separation tL between the shorter side portions of the well contact 2 and the diffusion layers 5 and 4 of the anode and cathode is longer as in the semiconductor integrated circuit of Example 2 shown in FIG. 8.

Therefore, in Example 3 shown in FIG. 13, the space between the longer sides of the well contact 2 and the diffusion layers 4 of the cathode can be reduced as seen from comparison with FIG. 8. Thus, Example 3 provides the effect of reducing the area of the protection device in addition to the functions and effects of Example 2.

(Variation 1 of Example 3)

Figure 14:
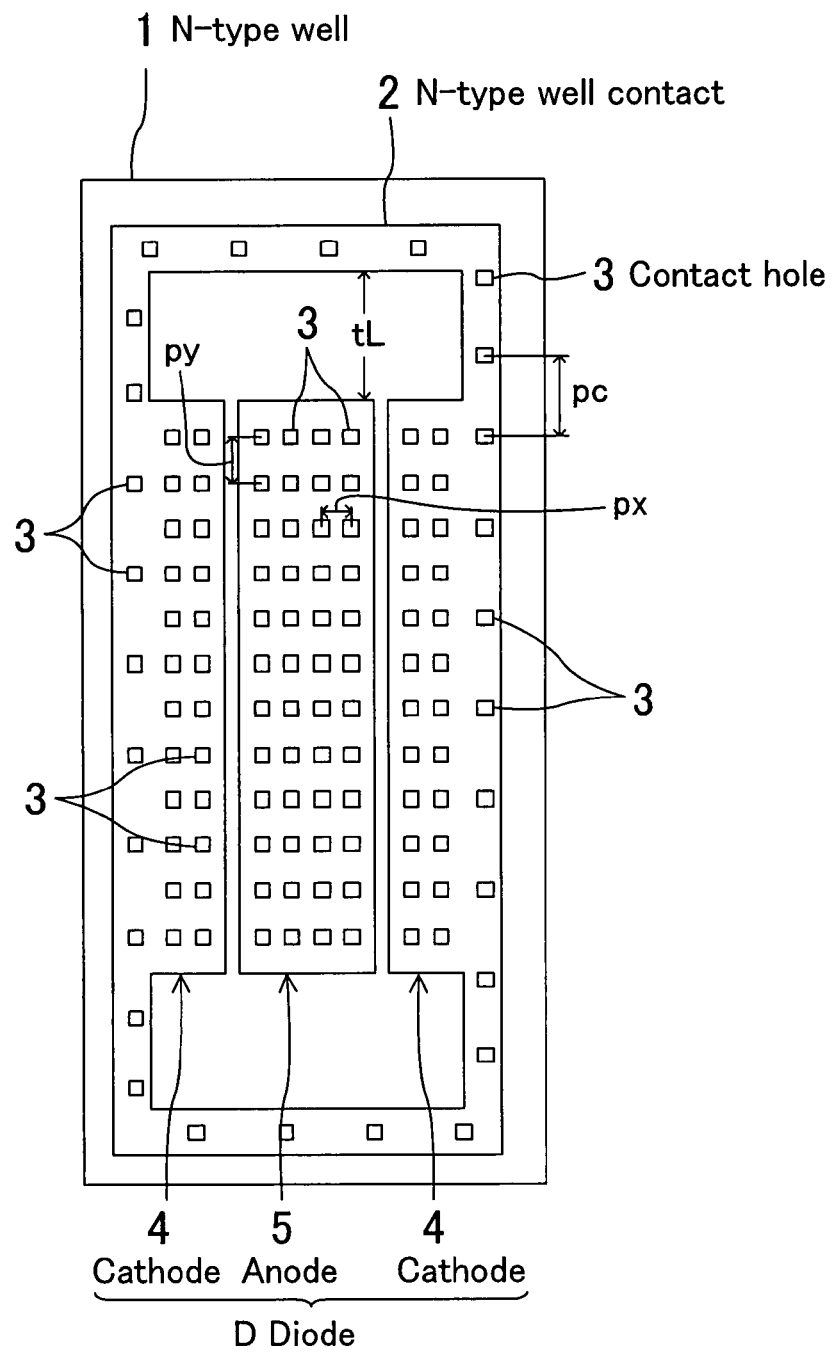
FIG. 14 shows a layout structure of a semiconductor integrated circuit according to Variation 1 of Example 3.

FIG. 14 shows Variation 1 of Example 3.

In Variation 1 of Example 3, the longer side portions of the well contact 2 share a diffusion layer with the two N-type diffusion layers 4 constituting the cathode, and separation tL between the shorter side portions of the well contact 2 and the diffusion layers 5 and 4 of the anode and cathode is longer, as in Example 3 shown in FIG. 13. In addition, Variation 1 of Example 3 shown in FIG. 14 is the same as Example 1 of FIG. 1 in that the positioning pitch "pc" of the contact holes 3 formed in the well contact 2 is greater than the maximum pitch of the contact holes 3 in the P-type diffusion layer 5 which constitutes the anode, i.e., the vertical positioning pitch "py" (pc>py).

Therefore, Variation 1 of Example 3 provides the functions and effects of Example 1 in addition to those of Example 3.

(Variation 2 of Example 3)

Figure 15:
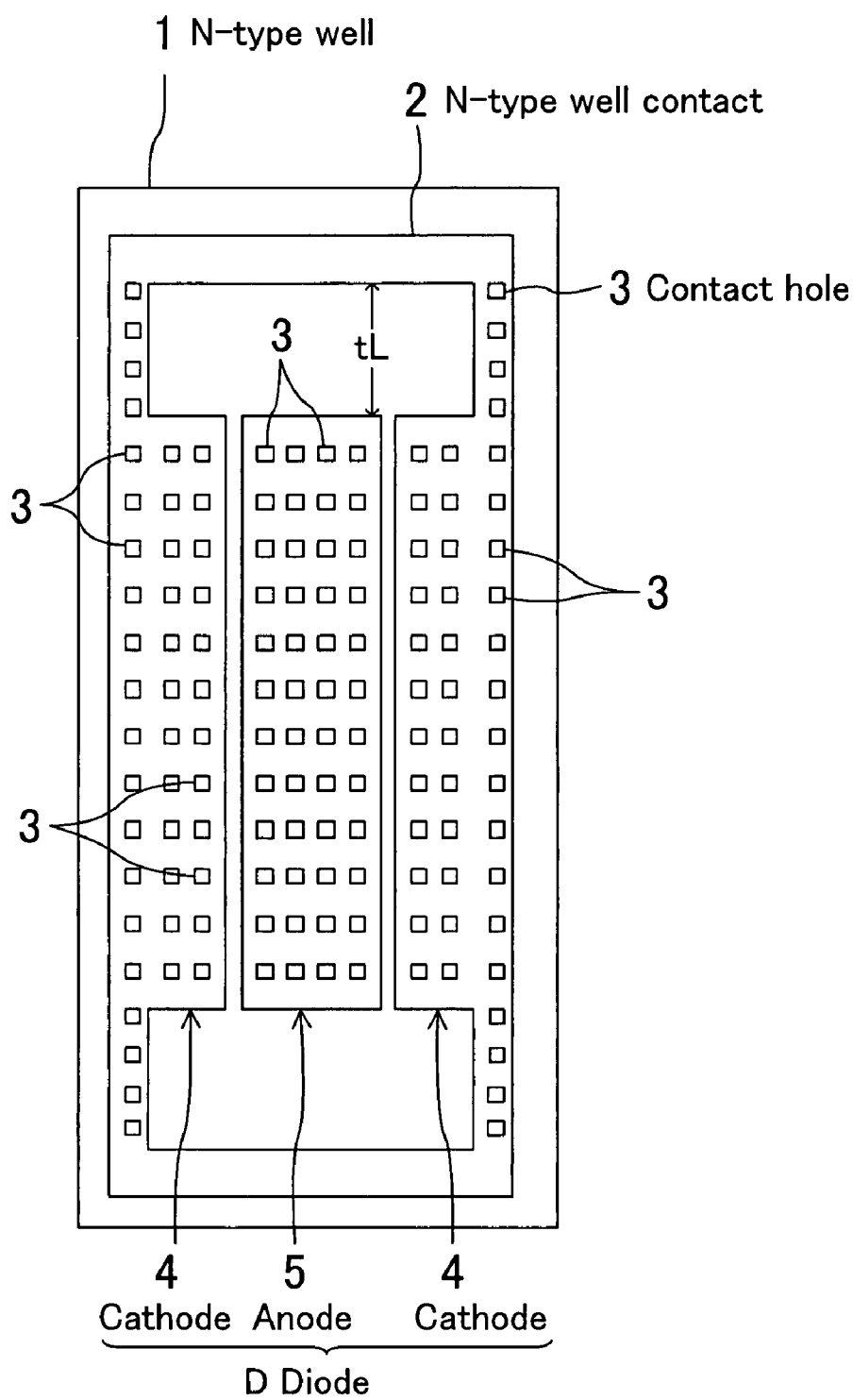
FIG. 15 shows a layout structure of a semiconductor integrated circuit according to Variation 2 of Example 3.

FIG. 15 shows Variation 2 of Example 3.

Variation 2 of Example 3 is different from Variation 1 of Example 3 in the following aspects. In Variation 2 of Example 3, the positioning pitch of the contact holes 3 formed in the well contact 2 is equal to the positioning pitch of the contact holes 3 of the diffusion layers 4 which constitute the cathode along the longer sides of the diffusion layers 4 as shown in FIG. 15, although in Variation 1 of Example 3 the positioning pitch "pc" of the contact holes 3 formed in the well contact 2 is longer. In Variation 2 of Example 3, the shorter side portions of the well contact 2 do not have the contact holes 3 as shown in FIG. 4 of Variation 1 of Example 1.

Therefore, Variation 2 of Example 3 provides the functions and effects of Variation 1 of Example 1 in addition to those of Example 3.

(Variation 3 of Example 3)

Figure 16:
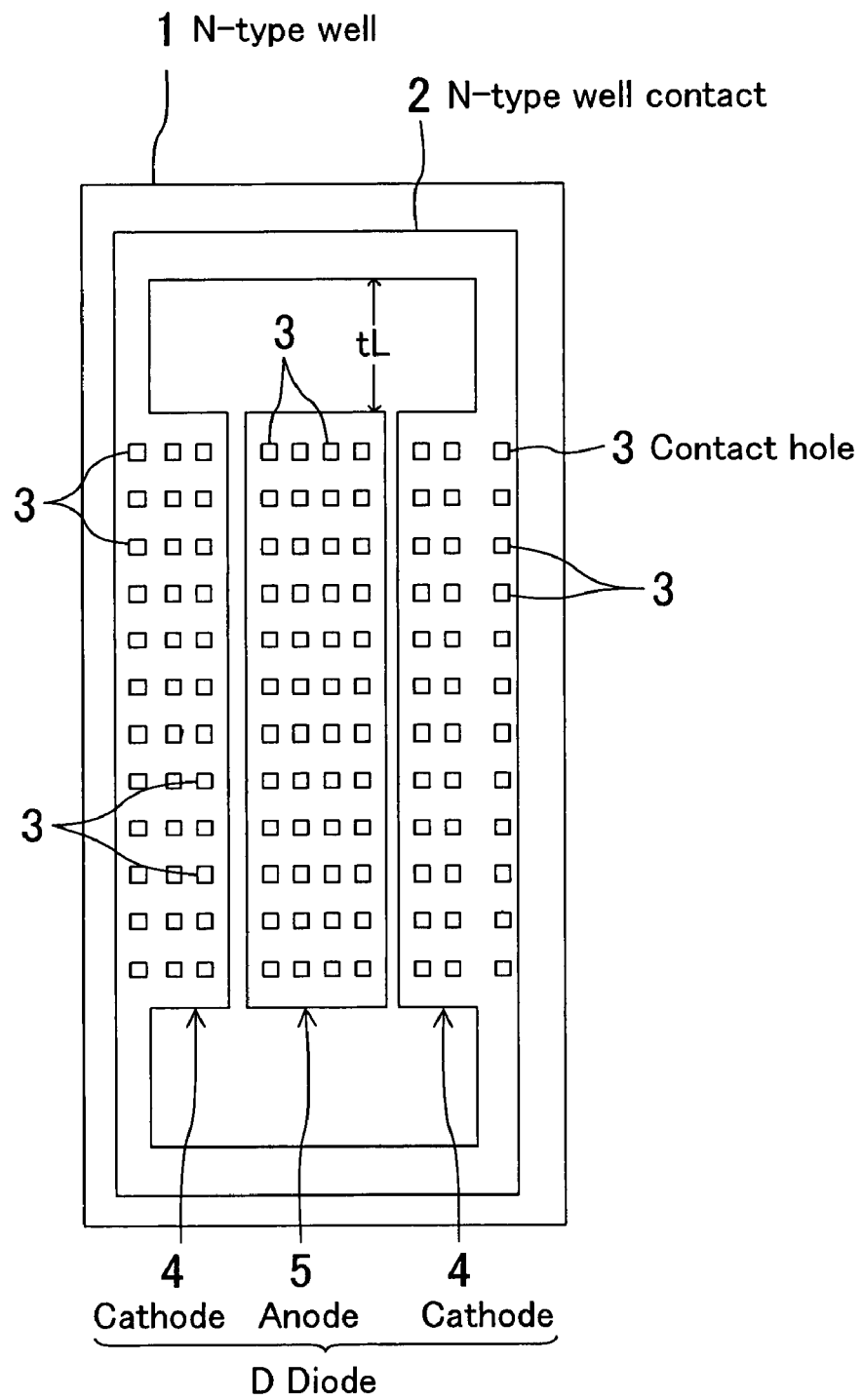
FIG. 16 shows a layout structure of a semiconductor integrated circuit according to Variation 3 of Example 3.

FIG. 16 shows Variation 3 of Example 3.

The structure of Variation 3 of Example 3 is different from Variation 2 of Example 3 shown in FIG. 15 in that parts of the longer side portions of the well contact 2 which do not face the diffusion layers 4 constituting the cathode do not have the contact holes 3, and that the contact holes 3 are formed only in parts of the longer side portions of the well contact 2 which face the diffusion layers 4 constituting the cathode. The other features of the structure are the same as those of FIG. 15.

Therefore, Variation 3 of Example 3 provides the functions and effects of Variation 2 of Example 1 in addition to those of Example 3.

(Variation 4 of Example 3)

Figure 17:
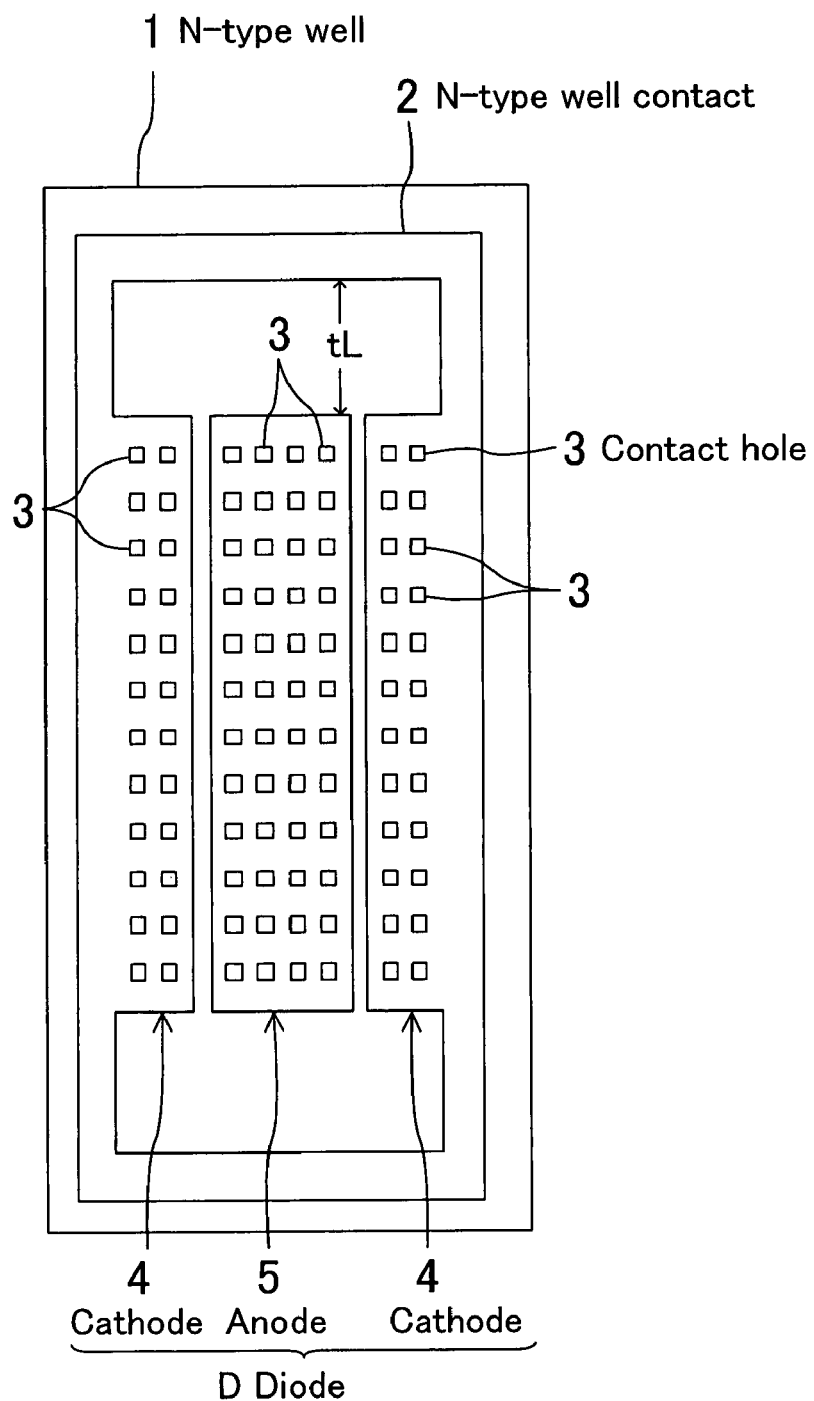
FIG. 17 shows a layout structure of a semiconductor integrated circuit according to Variation 4 of Example 3.

FIG. 17 shows Variation 4 of Example 3.

The structure of Variation 4 of Example 3 is different from Variation 3 of Example 3 shown in FIG. 16 in that the longer side portions of the well contact 2 do not have the contact holes 3. As a result, the number of contact holes 3 of the diffusion layer 5 which constitutes the anode is equal to the total number of contact holes 3 of the two diffusion layers 4 which constitute the cathode. The other features of the structure are the same as those of FIG. 16.

Thus, in Variation 4 of Example 3, in addition to the functions and effects of Variation 3 of Example 3, the number of contact holes 3 of the diffusion layer 5 which constitutes the anode is equal to the number of contact holes 3 of the diffusion layers 4 which constitute the cathode. Accordingly, the current density in the anode is equal to the current density in the cathode. Therefore, the reliability of the diode D is improved.

EXAMPLE 4

Next, a semiconductor integrated circuit according to Example 4 of the present invention is described with reference to FIG. 18.

Figure 18:
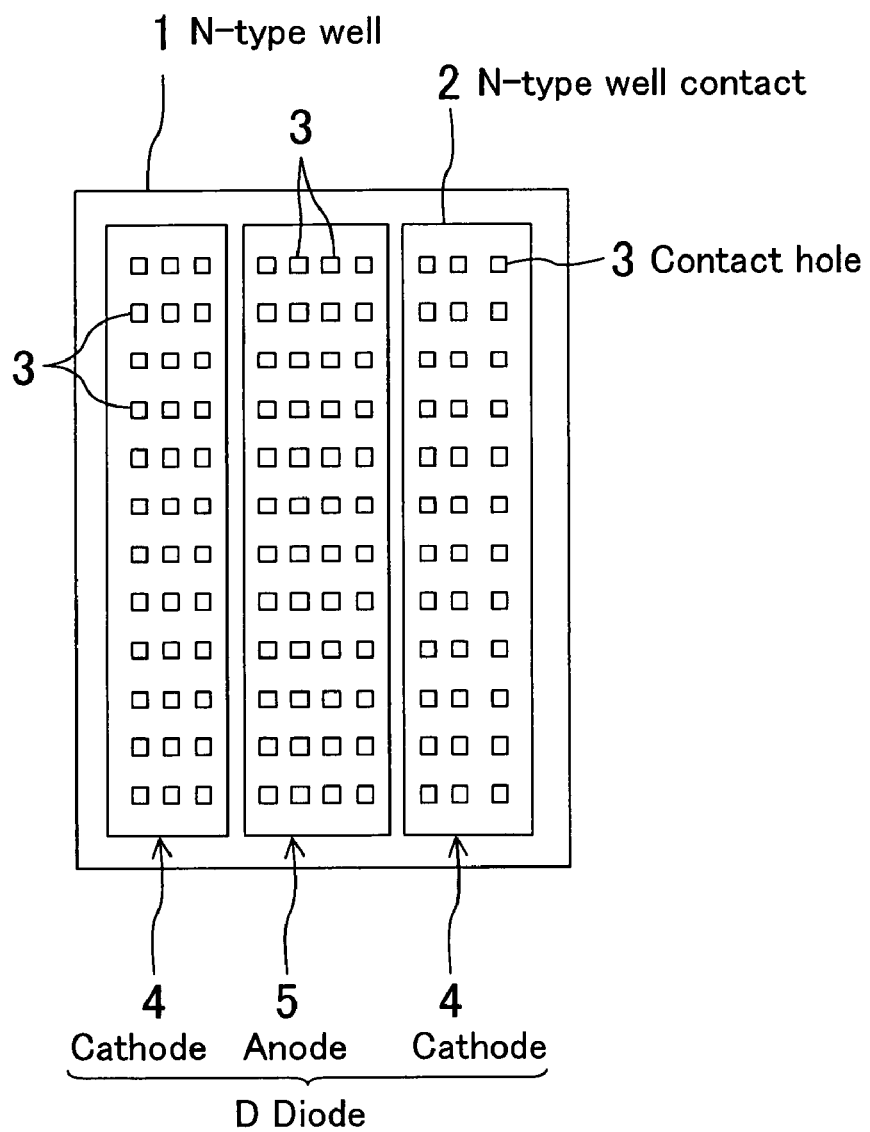
FIG. 18 shows a layout structure of a semiconductor integrated circuit according to Example 4 of the present invention.

In Example 4, as shown in FIG. 18, a P-type diffusion layer 5 which constitutes the anode of a diode D is provided at the center, while two N-type diffusion layers 4 which constitute the cathode are provided on the left and right sides of the diffusion layer 5 of the anode. Example 4 does not have a rectangular well contact surrounding the diode D. Instead, the two N-type diffusion layers 4 which constitute the cathode substitute for the well contact.

Since in Example 4 an exclusive well contact is not provided, all of currents from the diffusion layer 5 which constitutes the anode infallibly flow into the diffusion layers 4 which constitute the cathode. Namely, the current flow from the diffusion layer 5 of the anode to the well contact, which would occur in the conventionally-proposed example, does not occur. Thus, convergence of the current at contact holes 3 of the diffusion layer 5 of the anode is infallibly reduced. Therefore, breakage and deterioration in reliability of the diode D can be prevented. Further, in Example 4, the area of the semiconductor integrated circuit is effectively reduced by omission of the exclusive well contact.

(Variation 1 of Example 4)

Figure 19:
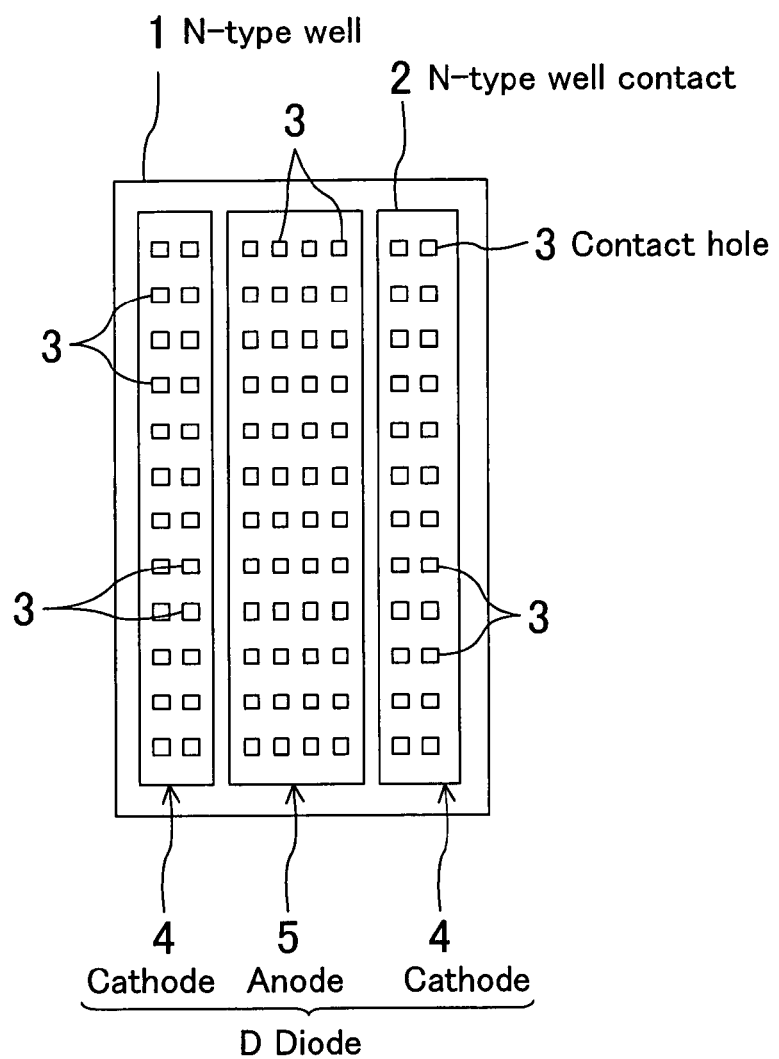
FIG. 19 shows a layout structure of a semiconductor integrated circuit according to Variation 1 of Example 4.

FIG. 19 shows Variation 1 of Example 4.

In Variation 1 of Example 4, as shown in FIG. 19, the semiconductor integrated circuit does not have an exclusive well contact. Instead, the two N-type diffusion layers 4 which constitute the cathode substitute for the well contact. Further, the number of contact holes 3 of the diffusion layer 5 which constitutes the anode is equal to the total number of contact holes 3 of the diffusion layers 4 which constitute the cathode.

Thus, in Variation 1 of Example 4, in addition to the functions and effects of Example 4, the largeness of the current flowing out of the anode is equal to the largeness of the current flowing into the cathode. Accordingly, convergence of the current at the contact holes 3 of the diffusion layer 5 which constitutes the anode is avoided. Therefore, breakage and deterioration in reliability of the diode D can be prevented.

What is claimed is:

1. A semiconductor integrated circuit, comprising:
   a diode including a first polarity-type diffusion layer and a second polarity-type diffusion layer which is disposed next to the first polarity-type diffusion layer in a first direction in a plan view; and
   a second polarity-type contact region surrounding, in a plan view, four sides of the diode including the first polarity-type diffusion layer and the second polarity-type diffusion layer, the contact region having a first contact region extending along the first direction and a second contact region extending along a second direction perpendicular to the first direction in a plan view,
   wherein each of the first polarity-type diffusion layer and second polarity-type diffusion layer of the diode has a plurality of contact holes for electrical connection with an external device, and
   the second contact region extending along the second direction of the contact region has a plurality of contact holes and the first contact region extending along the first direction has no contact hole, in a plan view.

2. The semiconductor integrated circuit of claim 1, wherein the second contact region has the plurality of contact holes only in a portion corresponding to a portion that the first polarity-type diffusion layer and the second polarity-type diffusion layer face each other.

3. A semiconductor integrated circuit, comprising:
a diode including a first polarity-type diffusion layer and a second polarity-type diffusion layer which is disposed next to the first polarity-type diffusion layer in a first direction in a plan view; and
a second polarity-type contact region extending along a second direction perpendicular to the first direction in a plan view and disposed next to the second polarity-type diffusion layer of the diode in the first direction,
wherein each of the first polarity-type diffusion layer and second polarity-type diffusion layer of the diode and the contact region has a plurality of contact holes for electrical connection with an external device.

4. A semiconductor integrated circuit, comprising:
a diode including a first polarity-type diffusion layer which and a second polarity-type diffusion layer which is disposed next to the first polarity-type diffusion layer in a first direction in a plan view; and
a second polarity-type contact region surrounding, in a plan view, four sides of the diode including the first polarity-type diffusion layer and the second polarity-type diffusion layer, the contact region having a first contact region extending along the first direction and a second contact region extending along a second direction perpendicular to the first direction in a plan view,
wherein each of the first polarity-type diffusion layer and second polarity-type diffusion layer of the diode and contact region has a plurality of contact holes for electrical connection with an external device, and
a first distance between a nearest periphery of the diode and the first contact region of the contact region is larger than a second distance between a nearest periphery of the diode and the second contact region of the contact region.

5. The semiconductor integrated circuit of claim 4, wherein a positioning pitch of the plurality of contact holes of the second polarity-type contact region is greater than a positioning pitch of the plurality of contact holes of the first polarity-type diffusion layer.

6. The semiconductor integrated circuit of claim 4, wherein the first contact region has no contact hole.

7. The semiconductor integrated circuit of claim 4, wherein the plurality of contact holes disposed in the contact region is disposed only in the second contact region.

8. The semiconductor integrated circuit of claim 1, wherein the first polarity-type diffusion layer of the diode and the second polarity-type diffusion layer of the diode have the shape of a rectangular stripe.

9. The semiconductor integrated circuit of claim 3, wherein the first polarity-type diffusion layer of the diode and the second polarity-type diffusion layer of the diode have the shape of a rectangular stripe.

10. The semiconductor integrated circuit of claim 4, wherein the first polarity-type diffusion layer of the diode and the second polarity-type diffusion layer of the diode have the shape of a rectangular stripe.

11. A system LSI, comprising:
a digital circuit and an analog circuit which operate on separate power supplies; and
a single unit of protection device formed by two semiconductor integrated circuits of claim 1 and provided between the digital circuit and the analog circuit for allowing electrostatic discharge from the digital circuit to the analog circuit and electrostatic discharge from the analog circuit to the digital circuit.

12. A system LSI, comprising:
a digital circuit and an analog circuit which operate on separate power supplies; and
a single unit of protection device formed by two semiconductor integrated circuits of claim 3 and provided between the digital circuit and the analog circuit for allowing electrostatic discharge from the digital circuit to the analog circuit and electrostatic discharge from the analog circuit to the digital circuit.

13. A system LSI, comprising:
a digital circuit and an analog circuit which operate on separate power supplies; and
a single unit of protection device formed by two semiconductor integrated circuits of claim 4 and provided between the digital circuit and the analog circuit for allowing electrostatic discharge from the digital circuit to the analog circuit and electrostatic discharge from the analog circuit to the digital circuit.

14. The semiconductor integrated circuit of claim 1, wherein the second polarity-type diffusion layer of the diode includes two second polarity-type diffusion layers which sandwich the first polarity-type diffusion layer of the diode, in a plan view.

15. The semiconductor integrated circuit of claim 3, wherein the second polarity-type diffusion layer of the diode includes two second polarity-type diffusion layers which sandwich the first polarity-type diffusion layer of the diode, in a plan view.

16. The semiconductor integrated circuit of claim 4, wherein the second polarity-type diffusion layer of the diode includes two second polarity-type diffusion layers which sandwich the first polarity-type diffusion layer of the diode, in a plan view.

17. The semiconductor integrated circuit of claim 1, wherein al least one of the first polarity-type diffusion layer and the second polarity-type diffusion layer includes at least two rows of the contact holes arranged in the first direction, each of the at least two rows including contact holes arranged along the second direction.

18. The semiconductor integrated circuit of claim 3, wherein al least one of the first polarity-type diffusion layer and the second polarity-type diffusion layer includes at least two rows of the contact holes arranged in the first direction, each of the at least two rows including contact holes arranged along the second direction.

19. The semiconductor integrated circuit of claim 4, wherein al least one of the first polarity-type diffusion layer and the second polarity-type diffusion layer includes at least two rows of the contact holes arranged in the first direction, each of the at least two rows including contact holes arranged along the second direction.

* * * * *